United States Patent
Zeng et al.

(10) Patent No.: US 10,325,967 B2
(45) Date of Patent: Jun. 18, 2019

(54) ORGANIC LIGHT EMITTING DISPLAY PANEL, DRIVING METHOD THEREOF AND ORGANIC LIGHT EMITTING DISPLAY APPARATUS

(71) Applicant: SHANGHAI TIANMA MICRO-ELECTRONICS CO., LTD., Shanghai (CN)

(72) Inventors: Yang Zeng, Shanghai (CN); Qing Zhang, Shanghai (CN); Lihua Wang, Shanghai (CN); Liang Xie, Shanghai (CN); Lingxiao Du, Shanghai (CN); Hong Ding, Shanghai (CN); Huiping Chai, Shanghai (CN); Kang Yang, Shanghai (CN); Qijun Yao, Shanghai (CN)

(73) Assignee: SHAIGHAI TIANMA MICRO-ELECTRONICS CO., LTD., Shanghai (CN)

( * ) Notice: Subject to any disclaimer, the term of this patent is extended or adjusted under 35 U.S.C. 154(b) by 8 days.

(21) Appl. No.: 15/787,481

(22) Filed: Oct. 18, 2017

(65) Prior Publication Data

US 2018/0040675 A1 Feb. 8, 2018

(30) Foreign Application Priority Data

Apr. 27, 2017 (CN) .......................... 2017 1 0287806

(51) Int. Cl.
*H01L 27/32* (2006.01)
*G06K 9/00* (2006.01)
(Continued)

(52) U.S. Cl.
CPC .......... *H01L 27/323* (2013.01); *G06F 3/0412* (2013.01); *G06F 3/0416* (2013.01);
(Continued)

(58) Field of Classification Search
None
See application file for complete search history.

(56) References Cited

U.S. PATENT DOCUMENTS

2004/0252867 A1* 12/2004 Lan ..................... G06K 9/0004
382/124

FOREIGN PATENT DOCUMENTS

CN 205656407 U 10/2016

* cited by examiner

*Primary Examiner* — Kenneth B Lee, Jr.
(74) *Attorney, Agent, or Firm* — Alston & Bird LLP

(57) ABSTRACT

Embodiments of the present disclosure provide a display apparatus, a fingerprint identification method thereof, and an electronic device. The display apparatus includes: an organic light emitting layer and a fingerprint identification array. The organic light emitting layer includes a plurality of organic light emitting configurations. In a fingerprint identification phase, the plurality of organic light emitting configurations are arranged to emit light according to a first light emitting lattice and shift. A distance between any two adjacent organic light emitting configurations in the first light emitting lattice is greater than or equal to a minimum crosstalk-free distance. The minimum crosstalk-free distance is a maximum radius of a covering region formed on the fingerprint identification array by the light emitted from any organic light emitting configuration and then reflected through the first surface of the cover plate.

19 Claims, 23 Drawing Sheets

(51) Int. Cl.
*H01L 51/52* (2006.01)
*G06F 3/041* (2006.01)
*G06F 3/042* (2006.01)

(52) U.S. Cl.
CPC ......... *G06F 3/0421* (2013.01); *G06K 9/0002* (2013.01); *G06K 9/0008* (2013.01); *G06K 9/00053* (2013.01); *H01L 27/3234* (2013.01); *H01L 27/3246* (2013.01); *H01L 51/5203* (2013.01); *H01L 51/5237* (2013.01)

ORGANIC LIGHT EMITTING DISPLAY PANEL, DRIVING METHOD THEREOF AND ORGANIC LIGHT EMITTING DISPLAY APPARATUS

CROSS-REFERENCE TO RELATED APPLICATIONS

This application claims priority to a Chinese patent application No. CN201710287806.7 filed on Apr. 27, 2017, the disclosure of which is incorporated herein by reference in its entirety.

TECHNICAL FIELD

Embodiments of the present disclosure relate to display technology, and particularly relate to a display apparatus, a fingerprint identification method thereof, and an electronic device.

BACKGROUND

Fingerprints are inherent and unique for every person. With the development of science and technology, various display apparatuses with a fingerprint identification function, such as a mobile phone, a tablet computer, an intelligent wearable device and the like, have appeared in market. Before a user operates a display apparatus with the fingerprint identification function, he/she only needs to touch a fingerprint identification sensor of the display apparatus by a finger to perform an authority verification, thereby simplifying a process of the authority verification.

In an existing display apparatus with the fingerprint identification function, the light emitted from a light source for fingerprint identification irradiates a plurality of fingerprint identification sensors after being reflected by the finger, so that each fingerprint identification sensor receives crosstalk signals from other positions besides receiving fingerprint signals from a position corresponding to the fingerprint identification sensor. Accordingly, the precision of a fingerprint identification sensor is degraded.

SUMMARY

Embodiments of the present disclosure provide a display apparatus, a fingerprint identification method thereof, and an electronic device, to improve fingerprint identification precision of the display apparatus.

In a first aspect, embodiments of the present disclosure provide a display apparatus. The display apparatus includes: a display panel and a cover plate disposed on the display panel. The display panel includes an array substrate, an organic light emitting layer disposed at one side of the array substrate facing the cover plate, and a fingerprint identification array. The organic light emitting layer includes a plurality of organic light emitting configurations. Light emerges from a first surface of the cover plate facing away from the array substrate.

In a fingerprint identification phase, the plurality of organic light emitting configurations are arranged to emit light according to a first light emitting lattice. The first emitting lattice includes a plurality of organic light emitting configurations being illuminated, and the first emitting lattice shifts for each frame to be displayed. A distance between any two adjacent organic light emitting configurations in the first light emitting lattice is greater than or equal to a minimum crosstalk-free distance. The minimum crosstalk-free distance is a maximum radius of a covering region formed on the fingerprint identification array by the light emitted from any organic light emitting configuration and reflected through the first surface of the cover plate.

In a second aspect, embodiments of the present disclosure further provide an electronic device. The electronic device includes the above display apparatus.

In a third aspect, embodiments of the present disclosure further provide a fingerprint identification method of a display apparatus. The display apparatus includes: a display panel and a cover plate disposed on the display panel. The display panel includes an array substrate, an organic light emitting layer disposed at a side of the array substrate facing the cover plate, and a fingerprint identification array. The organic light emitting layer includes a plurality of organic light emitting configurations. Light emerges from a first surface of the cover plate facing away from the array substrate.

The fingerprint identification method includes:

in a fingerprint identification phase, controlling each of the organic light emitting configurations in the organic light emitting layer to emit light according to a first light emitting lattice, the first emitting lattice includes a plurality of organic light emitting configurations being illuminated, and the first emitting lattice shifts for each frame to be displayed, a distance between any two adjacent organic light emitting configurations in the first light emitting lattice is greater than or equal to a minimum crosstalk-free distance, the minimum crosstalk-free distance is a maximum radius of a covering region formed on the fingerprint identification array by the light emitted from any organic light emitting configuration and then reflected through the first surface of the cover plate; and performing, by the fingerprint identification array, fingerprint identification according to the light rays on each of the fingerprint identification units reflected through a touch body on the first surface of the cover plate.

In the display apparatus provided by embodiments of the present disclosure, in the fingerprint identification phase, a plurality of organic light emitting configurations emit light according to the first light emitting lattice. A distance between any two adjacent organic light emitting configurations in the first light emitting lattice is greater than or equal to a minimum crosstalk-free distance. The minimum crosstalk-free distance is a maximum radius of a covering region formed on the fingerprint identification array by the light emitted from any organic light emitting configuration and then reflected through the first surface of the cover plate. Apparently, reflected light of a fingerprint of any organic light emitting configuration which emits light in the first light emitting lattice never irradiate the fingerprint identification units corresponding to other organic light emitting configurations which simultaneously emit light, namely, the fingerprint identification unit corresponding to any organic light emitting configuration in the first light emitting lattice can only receive the fingerprint reflection light of the organic light emitting configuration corresponding thereto. Therefore, the fingerprint identification units do not receive crosstalk signals from other organic light emitting configurations, and accordingly, since a fingerprint identification circuit of the display apparatus performs fingerprint identification according to inductive signals generated by the fingerprint identification units, the fingerprint identification precision of the display apparatus can be improved.

BRIEF DESCRIPTION OF DRAWINGS

In order to more clearly describe technical solutions in embodiments of the present disclosure or an existing art, drawings to be used in description of embodiments or the existing art will be simply introduced. Apparently, the drawings in the description below are some embodiments of the present disclosure. For those ordinary skilled in the art, other drawings can also be obtained according to these drawings without contributing creative labor.

DETAILED DESCRIPTION

To make objectives, technical solutions and advantages of the present disclosure more clear, the technical solutions of the present disclosure will be clearly and fully described below through embodiments with reference to drawings for embodiments of the present disclosure. Apparently, described embodiments are some embodiments of the present disclosure, not all of the embodiments. All other embodiments obtained by those ordinary skilled in the art without contributing creative labor based on embodiments in the present disclosure belong to a protection scope of the present disclosure.

Figure 1A:
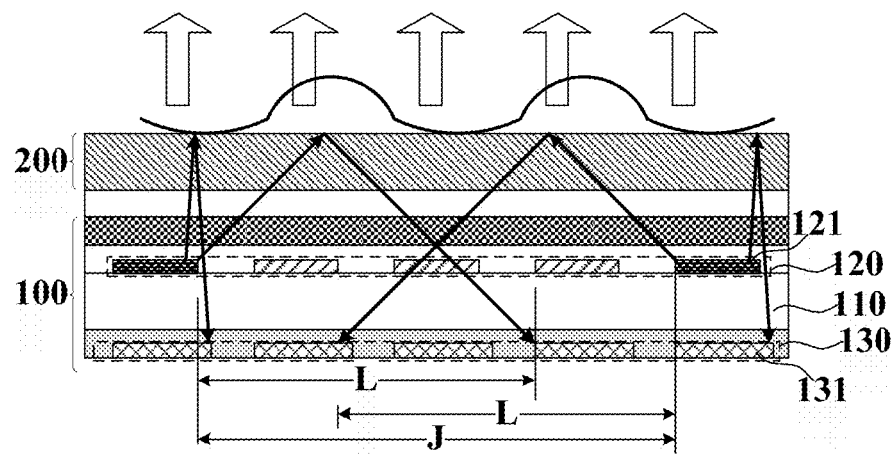
FIG. 1A is a schematic cross sectional diagram illustrating a display apparatus provided by an embodiment of the present disclosure.
Figure 1B:
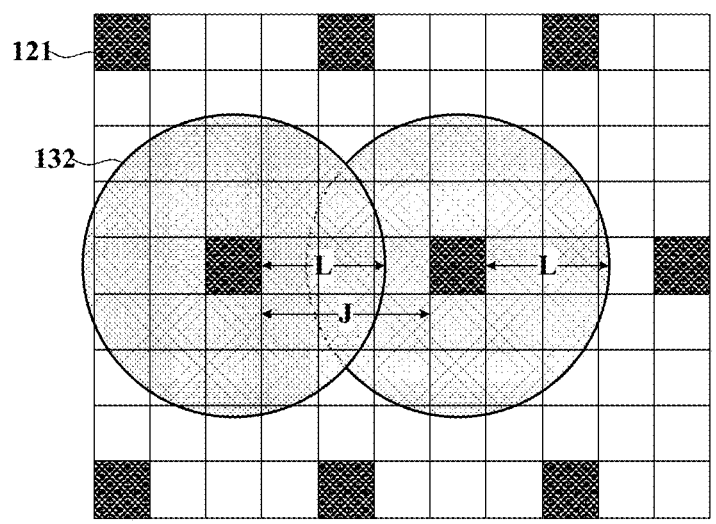
FIG. 1B is a local top view illustrating the display apparatus shown in FIG. 1A.
Figure 1C:
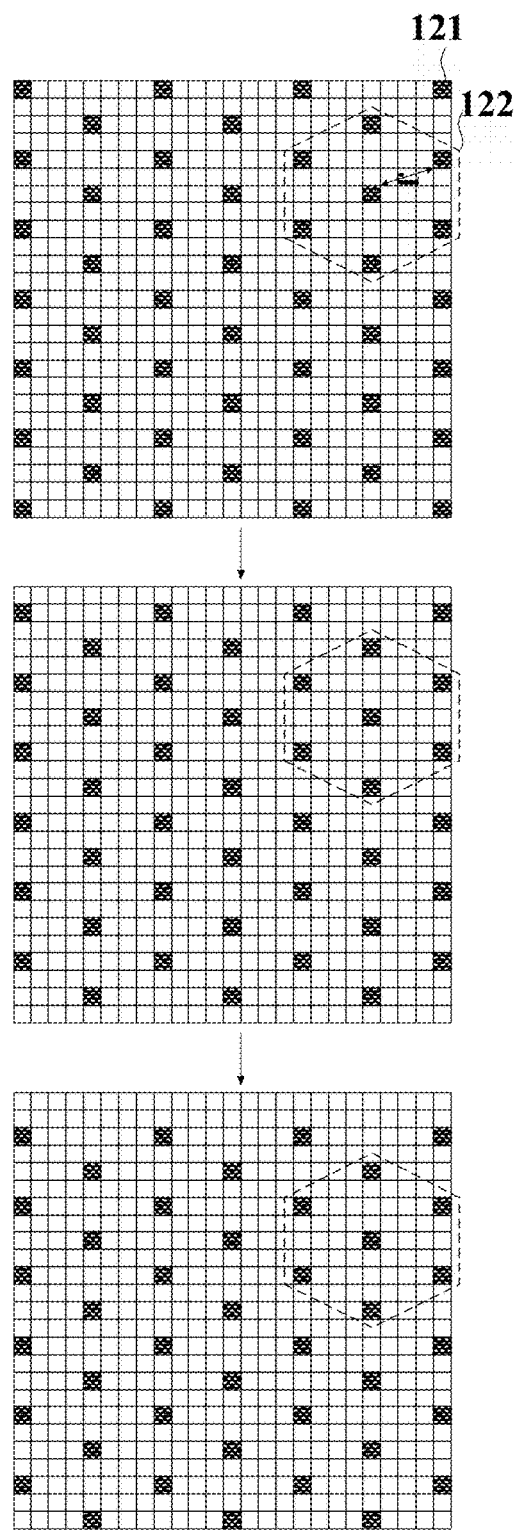
FIG. 1C is a scanning schematic diagram in a fingerprint identification phase of the display apparatus shown in FIG. 1A.

FIG. 1A is a schematic cross sectional diagram illustrating a display apparatus provided by embodiments of the present disclosure. FIG. 1B is a local top view illustrating the display apparatus shown in FIG. 1A. FIG. 1C is a scanning schematic diagram illustrating a fingerprint identification phase of a display apparatus shown in FIG. 1A. The display apparatus provided by embodiments of the present disclosure includes: a display panel 100 and a cover plate 200 disposed on the display panel 100. The display panel 100 includes an array substrate 110, an organic light emitting layer 120 disposed at one side of the array substrate 110 facing the cover plate 200, and a fingerprint identification array 130. The organic light emitting layer 120 includes a plurality of organic light emitting configurations 121. The cover plate 200 has a first surface facing away from the array substrate 100, and the first surface is a light exiting surface of the display apparatus. In a fingerprint identification phase, the plurality of organic light emitting configurations 121 emit light in the first light emitting lattice 122 and shift. A distance J between any two adjacent organic light emitting configurations 121 in the first light emitting lattice 122 is greater than or equal to a minimum crosstalk-free distance L. The minimum crosstalk-free distance L is a maximum radius of a covering region 132 formed on the fingerprint identification array 130 by the light emitted from any organic light emitting configuration 121 and then reflected by the first surface of the cover plate 200. In the present embodiment, the display apparatus is optionally an organic light emitting display apparatus. Optionally, the fingerprint identification array 130 is arranged at a side of the array substrate 110 facing away from the cover plate 200. The fingerprint identification array 130 includes a plurality of fingerprint identification units 131. The plurality of fingerprint identification units 131 and the plurality of organic light emitting configurations 121 are correspondingly arranged respectively.

Figure 2:
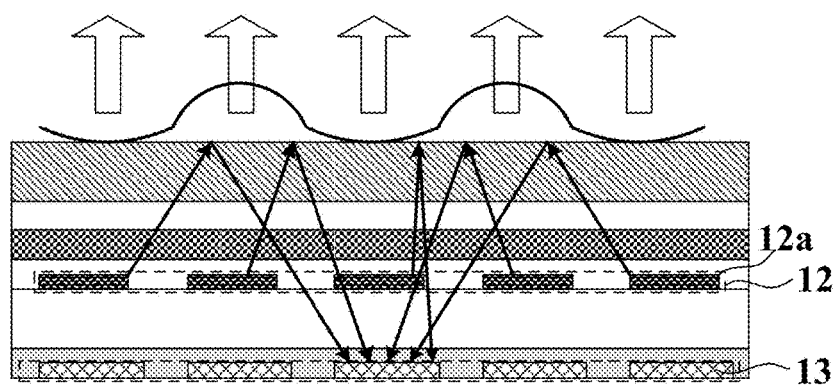
FIG. 2 is a schematic cross sectional diagram illustrating crosstalk of a display apparatus.

In the display apparatus provided by embodiments of the present disclosure, the fingerprint identification is performed by adopting the display panel 100 as a light source for fingerprint identification. Specifically, the organic light emitting configuration 121 of the organic light emitting layer 120 in the display panel 100 is adopted as a light source of the fingerprint identification unit 131 to perform the fingerprint identification. When a finger of a user presses the first surface of the cover plate 200, the light rays emitted from the organic light emitting configuration 121 irradiate the finger of the user through the first surface of the cover plate 200. Then, the light rays are reflected by the finger of the user to form a reflected light, and the fingerprint reflection light is incident on the first surface of the cover plate 200 and irradiates the fingerprint identification unit 131 corresponding to the organic light emitting configuration 121 emitting light. The fingerprint identification unit 131 which received the fingerprint reflection light generates an inductive signal, and a fingerprint identification circuit of the display apparatus can perform the fingerprint identification according to the inductive signal. The first light emitting lattices 122 are adopted as detection light sources of the fingerprint identification units 131 because the light rays emitted from the organic light emitting configurations 121 have a wide range of angular distribution. As shown in FIG. 2, in the case that all the organic light emitting configurations 12a of the organic light emitting layer 120 are adopted by the display apparatus to simultaneously emit light for performing the fingerprint identification, besides the fingerprint reflection light from the corresponding organic light emitting configuration 12a, each fingerprint identification unit 13 also receives crosstalk signals from other organic light emitting configurations 12a, causing low fingerprint identification precision.

In order to improve the fingerprint identification precision, in a fingerprint identification phase of the display apparatus provided by the present embodiment, a plurality of organic light emitting configurations 121 emit light in the first light emitting lattice 122 and shift, and a distance J between any two adjacent organic light emitting configurations 121 in the first light emitting lattices 122 is greater than or equal to a minimum crosstalk-free distance L. As shown in FIG. 1A and FIG. 1B, the light rays emitted from the organic light emitting configurations 121 have angular distribution, so a covering region 132 is formed on the fingerprint identification array 130 by the light emitted from the organic light emitting configurations 121 and then reflected through the first surface of the cover plate 200. The fingerprint reflection light for the light emitted at any angle from the organic light emitting configurations 121 will fall into the covering region 132. A maximum radius of the covering region 132 is the minimum crosstalk-free distance L. In the present embodiment, since the distance J between any two adjacent organic light emitting configurations 121 in the first light emitting lattices 122 is greater than or equal to the minimum crosstalk-free distance L, the fingerprint reflection light for any organic light emitting configuration 121 will not irradiate the fingerprint identification units 131 corresponding to other organic light emitting configurations 121 which simultaneously emit light. In other words, each fingerprint identification unit 131 corresponding to any one of the organic light emitting configurations 121 in the first light emitting lattices 122 can only receive the fingerprint reflection light from the organic light emitting configuration 121 corresponding to the fingerprint identification unit. Therefore, in the display apparatus provided by the present embodiment, the fingerprint identification unit 131 will not receive the crosstalk signals from other organic light emitting configurations. Accordingly, the fingerprint identification circuit of the display apparatus performs fingerprint identification according to the inductive signals generated by the fingerprint identification unit 131, thereby improving the fingerprint identification precision of the display apparatus.

It should be noted that the fingerprint reflection light is a light reflected from the fingerprint of the finger of the user pressed on the first surface of the cover plate 200, and is generated by reflecting the light rays emitted from the organic light emitting configuration 121. Since a distance between the fingerprint of the finger of the user and the first surface of the cover plate 200 is very small compared with a thickness of the display apparatus, such distance has small influence on a scope of the covering region 132. Therefore, in the present embodiment, a reflection distance between the finger of the user and the first surface of the cover plate 200 is omitted in setting the minimum crosstalk-free distance L. In addition, the radius L of the covering region 132 should be substantially computed by taking the central point of the organic light emitting configuration 121 as the origin. However, a large number of organic light emitting configurations 121 are arranged in the actual display apparatus. Accordingly, the sizes of the organic light emitting configuration 121 is small. Therefore, in the present embodiment, the organic light emitting configuration 121 can be integrally regarded as the origin of the covering region 132. In other words, the radius L of the covering region 132 indicates a length from an edge of the organic light emitting configuration 121 to an edge of the covering region 132, and the sizes of the organic light emitting configuration 121 is not counted into the minimum crosstalk-free distance L. It can be understood by those skilled in the art that, the minimum crosstalk-free distance L is related to factors such as the thickness of the display apparatus, a light emergent angle of the organic light emitting configurations and the like. Therefore, the minimum crosstalk-free distances L of different display apparatuses are different in numerical values. In other optional embodiments, the size of the organic light emitting configuration is optionally counted into the minimum crosstalk-free distance L, which is not specifically limited in the present disclosure.

As mentioned above, the light rays emitted from the organic light emitting configurations 121 have angular distribution, and the minimum crosstalk-free distance L is a maximum radius of the covering region 132 formed on the fingerprint identification array 130 by the light emitted from any organic light emitting configuration 121 and reflected by the first surface of the cover plate 200. Apparently, a region, defined by the reflected light for the light rays emitted from the edge of the organic light emitting configurations 121 with a maximum angle, on the fingerprint identification array 130 is the covering region 132. Each reflected light for the light rays emitted from the organic light emitting configurations 121 with any angle falls into the covering region 132.

Figure 1D:
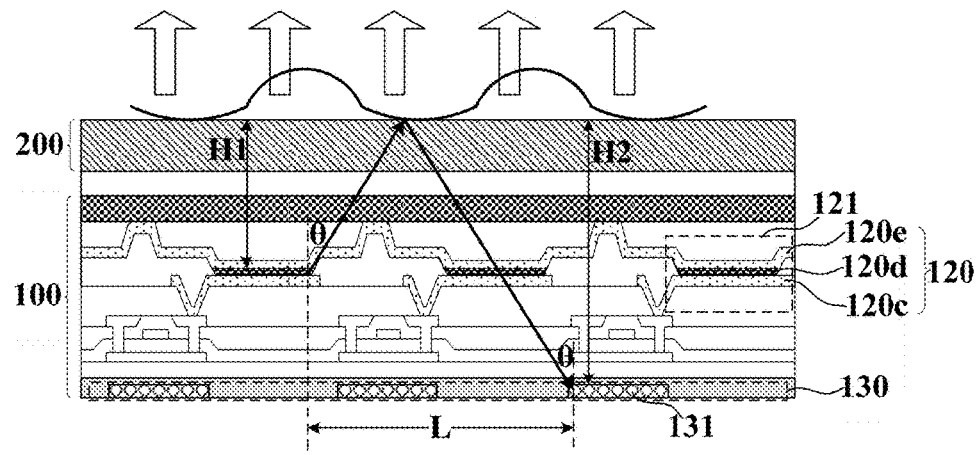
FIG. 1D is a schematic cross sectional diagram illustrating a specific structure of FIG. 1A.

As shown in FIG. 1D, in embodiments of the present disclosure, the organic light emitting layer 120 includes a first electrode 120c, a light emitting functional layer 120d and a second electrode 120e arranged successively along a direction in which the organic light emitting configurations 121 are away from the array substrate 110. A first electrode 120c, a light emitting functional layer 120d arranged correspondingly to the first electrode 120c, and a second electrode 120e corresponding to the first electrode 120c form an organic light emitting unit. If the organic light emitting layer 120 includes organic light emitting units of three colors, each organic light emitting configuration 121 includes organic light emitting units of three different colors. If signals are applied to the first electrode 120c and the second electrode 120e, the light emitting functional layer 120d emits light. The light rays emitted from the light emitting functional layer 120d has angular distribution. The fingerprint reflects the signals essentially through specular reflection. In other words, a reflection angle is equal to an incident angle. As can be known that $L=\tan\theta*H1+\tan\theta*H2$, where L is the minimum crosstalk-free distance; $\theta$ is an included angle between a direction corresponding to a preset brightness of the organic light emitting configurations 121 and a direction perpendicular to the organic light emitting layer; H1 is a height from the first surface of the cover plate 200 to the light emitting functional layer in the direction vertical to the display apparatus; H2 is a height from the first surface of the cover plate 200 to the fingerprint identification array 130 in the direction vertical to the display apparatus; and the preset brightness is less than or equal to 10% of a brightness in the direction perpendicular to the organic light emitting layer.

In the present embodiment, an angle of the light rays emitted from the organic light emitting configurations 121 is related to the brightness of the organic light emitting configurations 121. The brightness is a subjective feeling for (decoloration) light emitting intensity. The brightness of the organic light emitting configurations 121 in a vertical direction is defined as 100% in the present embodiment. The lower the percentage of the brightness is, the larger the corresponding light emergent angle (an included angle between the direction of the light emitted and the direction vertical to the organic light emitting layer) is and the weaker the light emitting intensity is. When the brightness of the organic light emitting configuration 121 is less than or equal to 10%, the light intensity of the light rays emitted from the organic light emitting configuration 121 is very weak. Therefore, the reflected light generated on the first surface of the cover plate 200 by the light rays emitted from the organic light emitting configuration 121 will not cause crosstalk to the fingerprint identification unit 131. Therefore, in the present embodiment, the light emergent angle of the organic light emitting configuration 121 is set by taking 10% of the brightness as a critical value. Based on this, $\theta$ is determined as follows: measuring the brightness of the organic light emitting configuration 121 in the vertical direction; determining a position corresponding to 10% of the brightness in the direction vertical to the organic light emitting layer; and determining $\theta$ according to the included angle between the direction of the position and the direction vertical to the organic light emitting layer. It can be understood for those skilled in the art that the light intensities of the organic light emitting configurations of different display apparatuses may be different, and preset brightness values may also be different accordingly. For example, in other optional embodiments, the preset brightness value is optionally 12% or 9% and the like of the brightness in the direction perpendicular to the organic light emitting layer, which is not limited in the present disclosure.

FIG. 1C illustrates a scanning schematic diagram of the display apparatus. In the phase of fingerprint identification, the display apparatus performs the fingerprint identification in a manner of screen scanning. Specifically, the organic light emitting configurations 121 are illuminated at the same time according to the first light emitting lattice 122, and the inductive signals generated by the fingerprint identification units 131 in positions corresponding to the illuminated organic light emitting configurations 121 are recorded. In a next screen, the organic light emitting configurations 121 illuminated at the same time shift and corresponding inductive signals are recorded until all the organic light emitting configurations 121 are illuminated circularly; and the fingerprint identification is performed based on the acquired inductive signals of each fingerprint identification unit 131. Since no crosstalk signal is received by the fingerprint identification unit 131 in the present embodiment, the fingerprint identification precision of the present embodiment is very high. It can be understood for those skilled in the art that the first light emitting lattice optionally is a minimum repeating unit formed by a plurality of organic light emitting configurations that emit light at the same time, and is not limited to a lattice formed by a plurality of organic light emitting configurations that emit light at the same time.

In the display apparatus provided by embodiments of the present disclosure, in the phase of fingerprint identification, a plurality of organic light emitting configurations emit light in the first light emitting lattice and shift. A distance between any two adjacent organic light emitting configurations in the first light emitting lattice is greater than or equal to the minimum crosstalk-free distance. The minimum crosstalk-free distance is a maximum radius of a covering region formed on the fingerprint identification array by the light emitted from any organic light emitting configuration and reflected through the first surface of the cover plate. Apparently, the fingerprint reflection light of any organic light emitting configuration in the first light emitting lattice will never irradiate the fingerprint identification units corresponding to other organic light emitting configurations that emit light simultaneously. In other words, each fingerprint identification unit only receives the fingerprint reflection light of the organic light emitting configuration corresponding to the fingerprint identification unit in the first light emitting lattice. Therefore, no crosstalk signal from other organic light emitting configurations is received by each fingerprint identification unit. Accordingly, the fingerprint identification precision of the display apparatus is improved because the fingerprint identification is performed by the fingerprint identification circuit of the display apparatus based on inductive signals generated by the fingerprint identification units.

It should be noted that the display apparatus shown in FIG. 1A is only one type of structure of the display apparatus in the present disclosure. A plurality of display apparatuses of different structures are further provided by other embodiments of the present disclosure.

Figure 3:
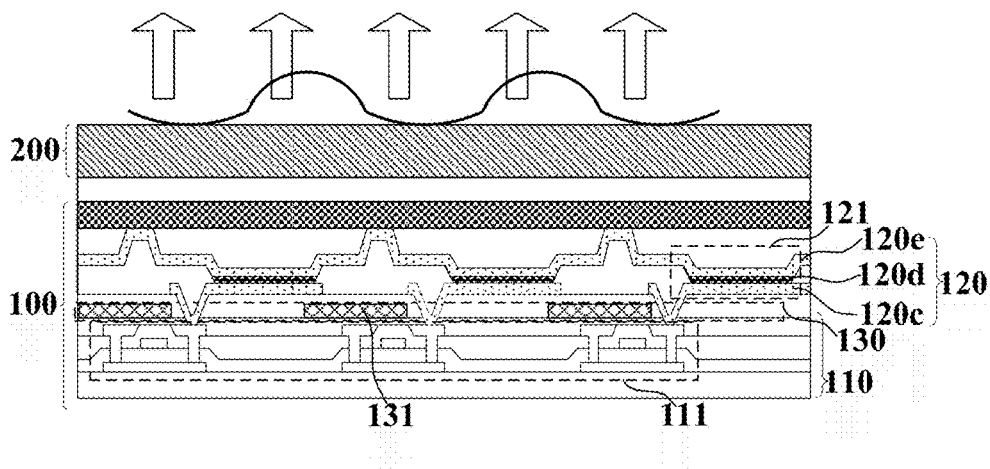
FIG. 3 is a schematic cross sectional diagram illustrating a second display apparatus provided by an embodiment of the present disclosure.

Embodiments of the present disclosure further provide a second type of display apparatus which is different from the display apparatus shown in FIG. 1A only in structures. Specifically, as shown in FIG. 3, in the display apparatus, a thin film transistor array 111, the fingerprint identification array 130 and the organic light emitting layer 120 are stacked at one side of the array substrate 110 facing the cover plate 200. As shown in FIG. 3, the fingerprint identification array 130 is arranged between the thin film transistor array 111 and the organic light emitting layer 120. The fingerprint identification array 130 and the thin film transistor array 111 are stacked and insulated from each other, and the fingerprint identification array 130 and the organic light emitting layer 120 are stacked and insulated from each other. The process of fingerprint identification of the display apparatus is similar to that of the display apparatus shown in FIG. 1A, and is not repeated herein. It should be noted that the fingerprint identification array 130 is arranged between the thin film transistor array 111 and the organic light emitting layer 120, and thus will not influence an aperture ratio of the first electrode in the organic light emitting configurations 121 in the organic light emitting layer 120. Therefore, an arrangement mode of the fingerprint identification units 131 in the fingerprint identification array 130 can be determined as required by products, and is not specifically limited in the present disclosure.

Figure 4A:
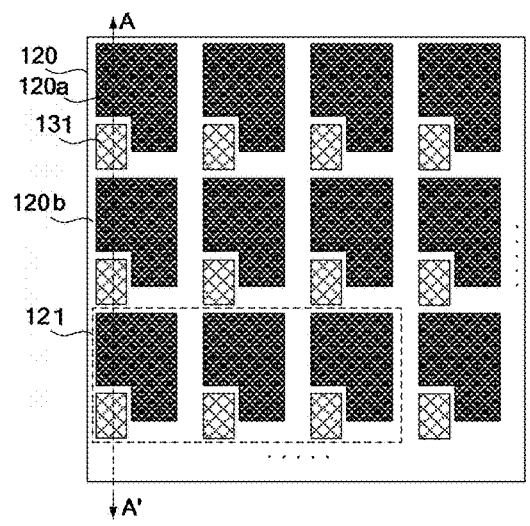
FIG. 4A is a schematic diagram illustrating a third display apparatus provided by an embodiment of the present disclosure.
Figure 4B:
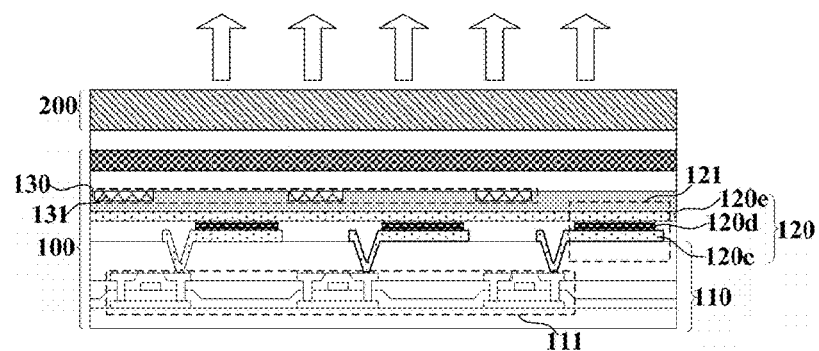
FIG. 4B is a cross sectional view of FIG. 4A cut along line A-A'.

Embodiments of the present disclosure further provide a third type of display apparatus which is different from any of the above display apparatuses only in structures. Specifically, FIG. 4A is a top view of the display apparatus. FIG. 4B is a cross sectional view of FIG. 4A along line A-A'. In the display apparatus shown in FIG. 4A to FIG. 4B, the thin film transistor array 111, the organic light emitting layer 120 and the fingerprint identification array 130 are stacked at a side of the array substrate 110 facing the cover plate 200. As shown in FIG. 4A, the organic light emitting layer 120 includes a display region 120a and a non-display region 120b. A projection of the fingerprint identification array 130 in the direction vertical to the display apparatus is within the non-display region 120b of the organic light emitting layer 120. As shown in FIG. 4A to FIG. 4B, the fingerprint identification array 130 is arranged on a surface of one side of the organic light emitting layer 120 facing the cover plate 200. The fingerprint identification array 130 and the organic light emitting layer 120 are stacked and insulated from each other. The fingerprint identification process of the display apparatus is similar to that of the display apparatus shown in FIG. 1A, and is not repeated herein. It should be noted that the fingerprint identification array 130 is arranged on the surface of the side of the organic light emitting layer 120 facing the cover plate 200. In order to avoid reducing the aperture ratio of the first electrode 120c in the organic light emitting configurations 121, projections of the fingerprint identification units 131 in the fingerprint identification array 130 in the direction vertical to the display apparatus are within the non-display region 120b of the organic light emitting layer 120.

Figure 5A:
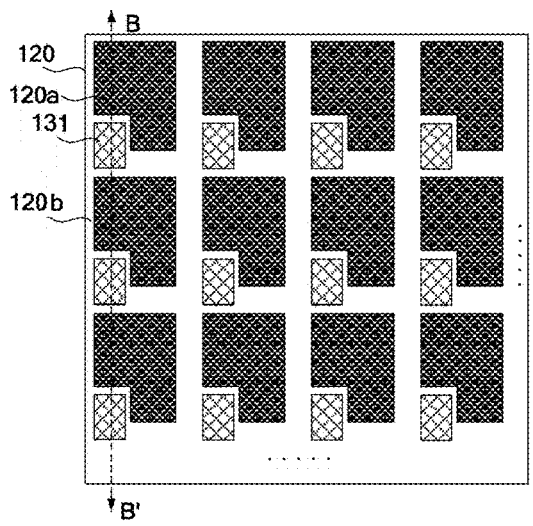
FIG. 5A is a schematic diagram illustrating a fourth display apparatus provided by an embodiment of the present disclosure.
Figure 5B:
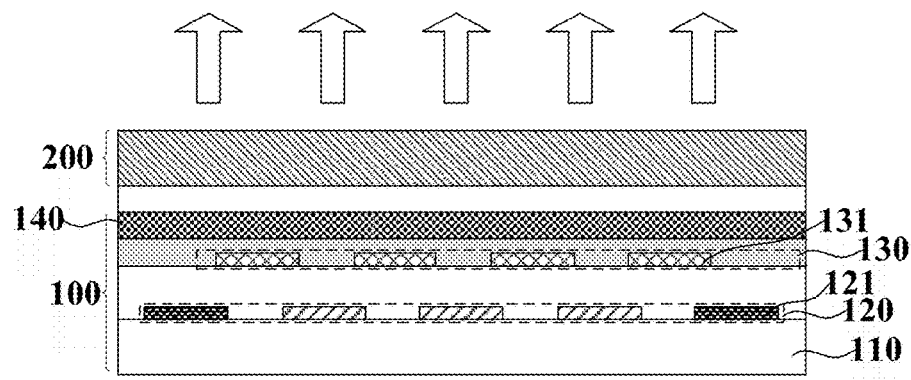
FIG. 5B is a cross sectional view of FIG. 5A cut along line B-B'.

Embodiments of the present disclosure further provide a fourth type of display apparatus which is different from any of the above display apparatuses only in structures. Specifically, FIG. 5A is a top view of the display apparatus, and FIG. 5B is a cross sectional view of FIG. 5A along line B-B'. In the display apparatus shown in FIG. 5A to FIG. 5B, the display panel 100 further includes an encapsulating glass 140 disposed at a side of the array substrate 110 facing the cover plate 200. The organic light emitting layer 120 is arranged at the side of the array substrate 110 facing the cover plate 200. The fingerprint identification array 130 is arranged at a side of the encapsulating glass 140 facing the array substrate 110. The organic light emitting layer 120 includes a display region 120a and a non-display region 120b. The projection of the fingerprint identification array 130 in the direction vertical to the display apparatus is within the non-display region 120b of the organic light emitting layer 120. The display apparatus is encapsulated with the encapsulating glass 140. The fingerprint identification array 130 is arranged at a side of the encapsulating glass 140 facing the array substrate 110, i.e., an inner side of the encapsulating glass 140. The fingerprint identification process of the display apparatus is similar to that of the display apparatus shown in FIG. 1A, and is not repeated herein. In order to avoid reducing the aperture ratio, the projections of the fingerprint identification units 131 in the fingerprint identification array 130 in the direction vertical to the display apparatus are within the non-display region 120b of the organic light emitting layer 120.

Figure 6A:
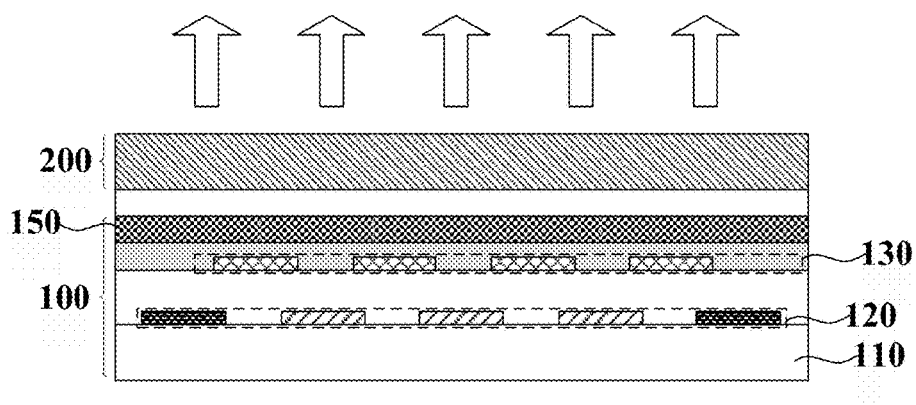
FIG. 6A to FIG. 6B are schematic cross sectional diagrams illustrating two display apparatuses provided by an embodiment of the present disclosure.
Figure 6B:
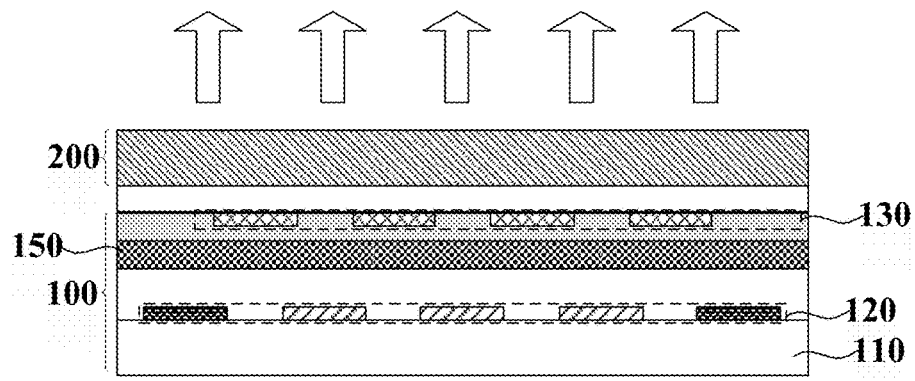
Figure 6C:
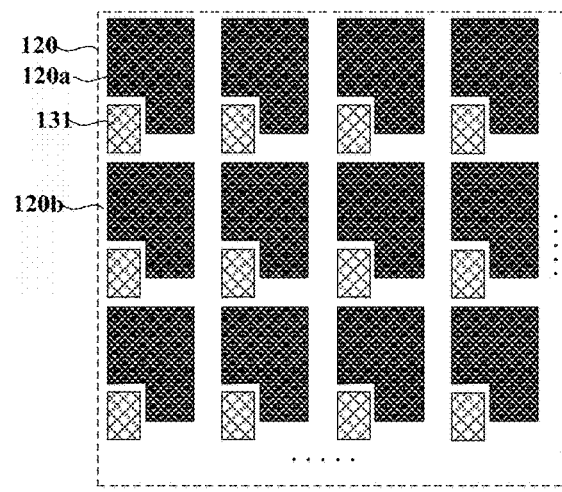
FIG. 6C is a top view illustrating the display apparatuses shown in FIG. 6A to FIG. 6B.

Embodiments of the present disclosure further provide two types of display apparatuses which are different from any of the above display apparatuses only in structures. Specifically, in the display apparatuses shown in FIG. 6A and FIG. 6B, the display panel 100 further includes a film encapsulating layer 150 disposed at a side of the array substrate 110 facing the cover plate 200. The organic light emitting layer 120 is arranged at the side of the array substrate 110 facing the cover plate 200. As shown in FIG. 6A, the fingerprint identification array 130 is arranged at a side of the film encapsulating layer 150 facing the array substrate 110. As shown in FIG. 6B, the fingerprint identification array 130 is arranged at a side of the film encapsulating layer 150 facing away from the array substrate 110. As shown in FIG. 6C, the organic light emitting layer 120 includes a display region 120a and a non-display region 120b. The projection of the fingerprint identification array 130 in the direction vertical to the display apparatus is within the non-display region 120b of the organic light emitting layer 120. The display apparatus is encapsulated with the film encapsulating layer 150. The fingerprint identification array 130 can be arranged at an inner side of the film encapsulating layer 150, and can also be arranged at an outer side of the film encapsulating layer 150. The fingerprint identification process of these display apparatuses is similar to that of the display apparatus shown in FIG. 1A, and is not repeated herein. In order to avoid reducing the aperture ratio, the projections of the fingerprint identification units 131 in the fingerprint identification array 130 in the direction vertical to the display apparatus are within the non-display region 120b of the organic light emitting layer 120.

Figure 7A:
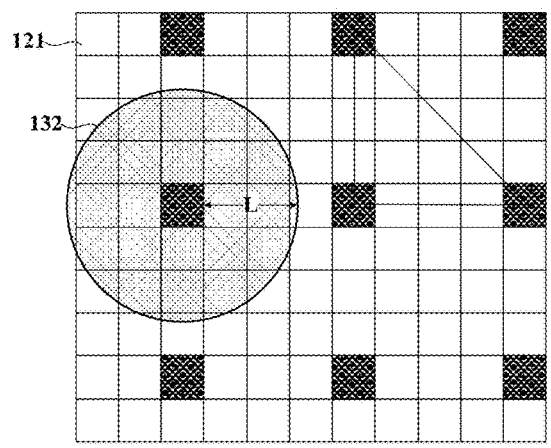
FIG. 7A to FIG. 7B are scanning schematic diagrams illustrating fingerprint identification phases of two display apparatuses provided by another embodiment of the present disclosure.

It should be noted that fingerprint information is read by the display apparatus in the manner of screen scanning. In one frame, the organic light emitting configurations 121 are controlled to emit light according to the first light emitting lattice 122, and the fingerprint signals from the fingerprint identification units 131 corresponding to the organic light emitting configurations 121 which emit light are collected. In a next frame, the organic light emitting configurations 121 which emit light shift. The organic light emitting configurations 121 which emit light shift successively until all the organic light emitting configurations 121 are illuminated through multiple frames. Apparently, the fingerprint information is read by the display apparatus through multiple frames. The smaller the number of the organic light emitting configurations 121 being illuminated in the one-frame picture is, the more the number of frames required for the reading of the fingerprint information is, and the longer the time required for reading the fingerprint information is. For example, assuming that the fingerprint information is read by the display apparatus in the manner of screen scanning shown in FIG. 7A, and the number of the organic light emitting configurations 121 which emit light simultaneously in the one frame (11*10 organic light emitting configurations) is 9. In this case, at least 12 frames need to be scanned to complete the reading of the fingerprint information from the fingerprint identification units 131 for all the organic light emitting configurations 121, and the time for reading the fingerprint information for each frame is constant.

Figure 7B:
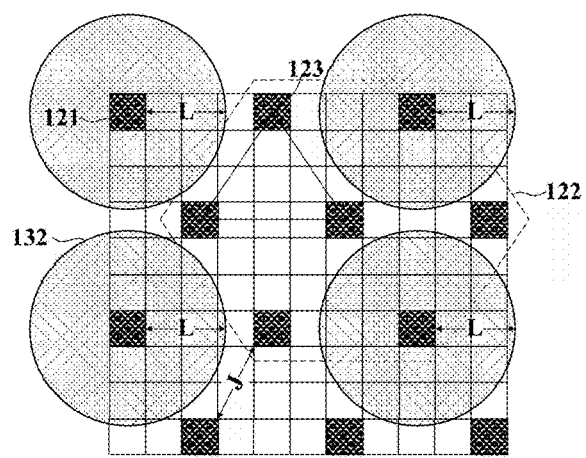

To reduce the time required for reading the fingerprint, optionally, as shown in FIG. 7B, the plurality of organic light emitting configurations 121 of the first light emitting lattice 122 form a plurality of patterns. As shown in FIG. 7B, an angle of each corner of pattern 123 with a minimum area among the plurality of patterns is not equal to 90°. Apparently, compared with FIG. 7A, the distance J between any two adjacent organic light emitting configurations 121 emitting light in the first light emitting lattice 122 is reduced. Accordingly, the number of the organic light emitting configurations 121 illuminated in the one frame is larger. Specifically, the number of the organic light emitting configurations 121 emitting light simultaneously in one frame (11*10 organic light emitting configurations) is 12, so at most 10 frames need to be scanned to complete the reading of the fingerprint information from the fingerprint identification units 131 for all the organic light emitting configurations 121. By forming a plurality of patterns with the plurality of organic light emitting configurations 121 in the first light emitting lattice 122 and setting the angle of each corner of the pattern 123 with a minimum area among the plurality of patterns to be not equal to 90°, the number of the organic light emitting configurations 121 illuminated simultaneously is increased while no signal crosstalk is ensured, so as to significantly reduce the time required for reading the fingerprint.

Figure 8A:
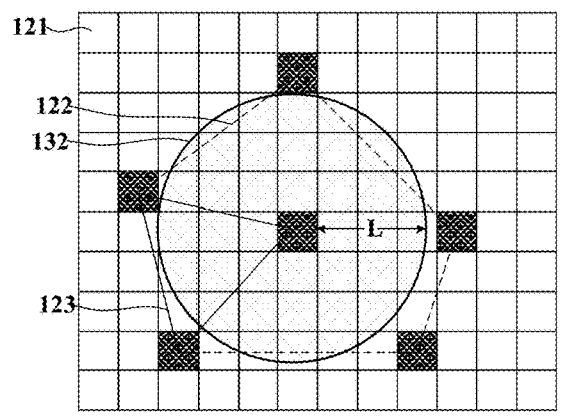
FIG. 8A to FIG. 8C are schematic diagrams illustrating three types of first light emitting lattices provided by another embodiment of the present disclosure.

Exemplarily, based on the display apparatuses described in any of above embodiments, optionally, the first light emitting lattice 122 is a pentagonal light emitting lattice including a central organic light emitting configuration 121 and five marginal organic light emitting configurations 121, as shown in FIG. 8A. The organic light emitting configurations 121 of the first light emitting lattice 122 form a plurality of patterns, and an angle of each corner of pattern 123 with a minimum area among the plurality of patterns is not equal to 90°. The pentagonal light emitting lattice can increase the number of the organic light emitting configurations 121 illuminated simultaneously while ensuring no signal crosstalk, thereby reducing the time required for reading the fingerprint.

Figure 8B:
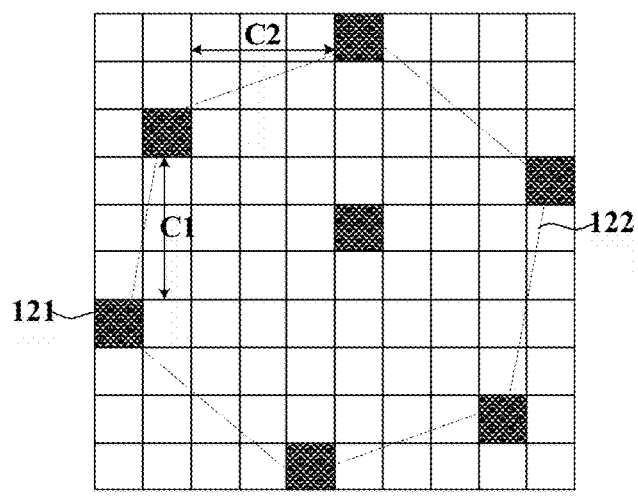

Exemplarily, based on the display apparatuses described in any of above embodiments, optionally, the first light emitting lattice 122 is a hexagonal light emitting lattice including a central organic light emitting configuration 121 and six marginal organic light emitting configurations 121, as shown in FIG. 8B. The hexagonal light emitting lattice can increase the number of the organic light emitting configurations 121 illuminated simultaneously while ensuring no signal crosstalk, thereby reducing the time required for reading the fingerprint.

Figure 8C:
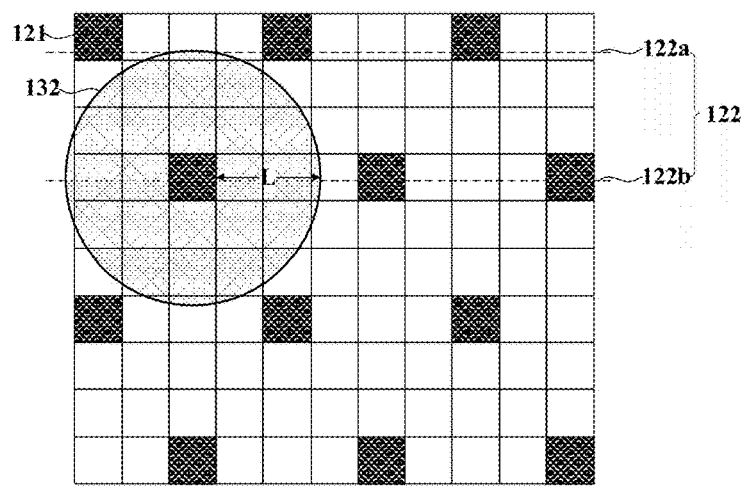

Exemplarily, based on the display apparatuses described in any of above embodiments, the first light emitting lattice 122 optionally includes first light emitting rows 122a and second light emitting rows 122b alternately arranged, and any organic light emitting configuration 121 in the first light emitting rows 122a and any organic light emitting configuration 121 in the second light emitting rows 122b are arranged in different columns, as shown in FIG. 8C. Compared with the scanning mode shown in FIG. 7A, by arranging any organic light emitting configuration 121 in the first light emitting rows 122a and any organic light emitting configuration 121 in the second light emitting rows 122b in different columns, the number of the organic light emitting configurations 121 illuminated simultaneously is increased while ensuring no signal crosstalk. In FIG. 8C, the number of the organic light emitting configurations 121 emitting light simultaneously in one frame (11*10 organic light emitting configurations) is 12, so at most 10 frames need to be scanned to complete the reading of the fingerprint information from the fingerprint identification units 131 for all the organic light emitting configurations 121, thereby significantly reducing the time required for reading the fingerprint.

Optionally, for any type of first light emitting lattice 122 provided by any of above embodiments, the distance J between any two adjacent organic light emitting configurations 121 in the first light emitting lattice 122 is equal to the minimum crosstalk-free distance L. Apparently, the fingerprint identification unit 131 corresponding to one of the organic light emitting configuration 121 emitting light in the first light emitting lattice 122 will not receive crosstalk signals from other organic light emitting configurations which emit light at the same time, thereby ensuring the accuracy of the fingerprint signal. Meanwhile, the distance J between any two adjacent organic light emitting configurations 121 in the first light emitting lattice 122 is equal to the minimum crosstalk-free distance L, thereby also increasing the number of the organic light emitting configurations 121 illuminated at the same time, reducing the time required for reading the fingerprint signal and improving fingerprint reading efficiency.

Optionally, in any type of first light emitting lattice 122 provided by any of above embodiments, for any two adjacent organic light emitting configurations 121 located in different rows in the first light emitting lattice 122, a vertical distance C1 (shown in FIG. 8B) from one of the two adjacent organic light emitting configurations 121 to the row in which the other organic light emitting configuration 121 is located is smaller than the minimum crosstalk-free distance L; and/or for any two adjacent organic light emitting configurations 121 located in different columns in the first light emitting lattice 122, a vertical distance C2 (shown in FIG. 8B) from one of the two adjacent organic light emitting configurations 121 to the column in which the other organic light emitting configuration 121 is located is smaller than the minimum crosstalk-free distance L. Such first light emitting lattice 122 ensures that the fingerprint identification unit 131 corresponding to the organic light emitting configuration 121 emitting light will not receive crosstalk signals from other organic light emitting configurations emitting light simultaneously, thereby improving the fingerprint identification precision. Meanwhile, with such first light emitting lattice 122, the number of the organic light emitting configurations 121 illuminated at the same time can also be increased, the time required for reading the fingerprint signal is reduced and the fingerprint reading efficiency is improved.

Herein, to describe the fingerprint reading efficiency of the display apparatus provided by embodiments of the present disclosure more clearly, a square array scanning mode and an orthohexagonal array scanning mode are taken as examples to describe the fingerprint reading efficiency of the display apparatus provided by embodiments of the present disclosure. The crosstalk can be avoided only if a distance between adjacent illuminated organic light emitting configurations 121 in a screen being scanned is set to be at least 20 organic light emitting configurations 121 (a distance between centers of two organic light emitting configurations). Specifically, the size of each of the 20 organic light emitting configurations 121 is 20 P.

Figure 9A:
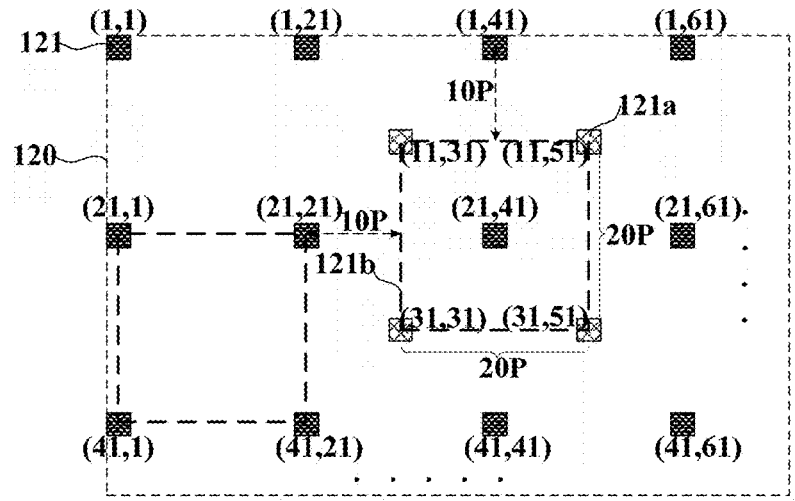
FIG. 9A is a scanning schematic diagram illustrating a square array of a display apparatus.

As for the square array scanning mode shown in FIG. 9A, coordinates of the illuminated organic light emitting configurations 121 are set as (row, column), and the coordinate of the first organic light emitting configuration 121 in an upper left corner is set as (1, 1). As can be seen, coordinates of the illuminated organic light emitting configurations 121 in the first row are successively set as (1,1), (1,21), (1,41) . . . ; coordinates of the illuminated organic light emitting configurations 121 in the second row are successively set as (21,1), (21,21), (21,41) . . . ; coordinates of the illuminated organic light emitting configurations 121 in the third row are successively set as (41,1), (41,21), (41, 41) . . . , and so on, thereby forming the coordinates of all the organic light emitting configurations 121 illuminated at the same time in one frame. The organic light emitting layer 120 of the display apparatus is divided transversely and longitudinally by having each illuminated organic light emitting configuration 121 as a central point. As a result, the organic light emitting layer 120 is divided into a plurality of identical bright regions 121b. The sizes of all the bright regions 121b are completely the same. Each bright region 121b includes one illuminated organic light emitting configuration 121 and a plurality of non-illuminated organic light emitting configurations 121a encircling the illuminated organic light emitting configuration 121. It should be noted that a corresponding region of the illuminated organic light emitting configuration 121, located at the edge of the organic light emitting layer 120, in the organic light emitting layer 120 is only a part of the bright region for the organic light emitting configuration 121.

Taking the illuminated organic light emitting configuration 121 (21,41) as an example, the bright region 121b corresponding to the illuminated organic light emitting configuration 121 (21,41) is encircled by four non-illuminated organic light emitting configurations 121a. The coordinates of the four non-illuminated organic light emitting configurations 121a are (11,31), (11,51), (31,31) and (31,51) respectively. Apparently, a length and a width of the bright region 121b are both 20 P. In other words, the number of the organic light emitting configurations forming the bright region 121b is 20*20=400. There is only one illuminated organic light emitting configuration (21,41) in the bright region 121b, that is, one organic light emitting configuration 121 is illuminated in every 400 organic light emitting configurations 121. Therefore, a density of the illuminated organic light emitting configurations in the bright region 121b is 1/400. Since the organic light emitting layer 120 is divided into a plurality of bright regions 121b, a density of the illuminated organic light emitting configurations 121 in one frame is 1/400. As can be seen, 20*20=400 frames need to be scanned to illuminate all the organic light emitting configurations 121 in the display apparatus. FIG. 9A only shows some organic light emitting configurations 121 illuminated at the same time and coordinates thereof, and non-illuminated organic light emitting configurations 121a at four vertexes of one bright region 121b and coordinates thereof.

Figure 9B:
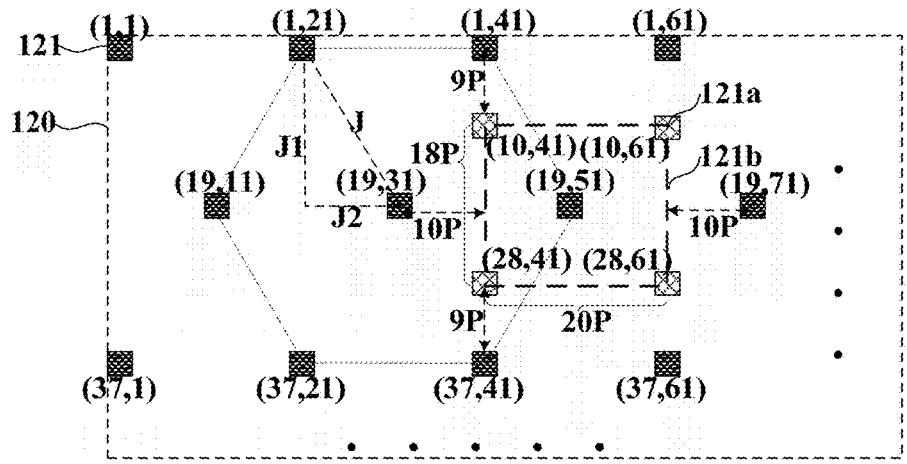
FIG. 9B is a scanning schematic diagram illustrating a hexagonal array of a display apparatus provided by an embodiment of the present disclosure.

As for the hexagonal array scanning mode shown in FIG. 9B, coordinates of the illuminated organic light emitting configurations 121 are set as (row, column), and the coordinate of the first organic light emitting configuration 121 in the upper left corner is set as (1, 1). In an orthohexagonal array, the distance J between any two adjacent illuminated organic light emitting configurations 121 reaches 20 organic light emitting configurations 121 (20 P), a distance J1 from the marginal organic light emitting configuration 121 located in different rows from the central organic light emitting configuration 121 to the row in which the central organic light emitting configuration 121 is located shall reach $10\ P\sqrt{3}\approx 18\ P$, and a distance J2 from the marginal organic light emitting configuration 121 located in different rows from the central organic light emitting configuration 121 to the column in which the central organic light emitting configuration 121 is located shall reach 10 P. As can be seen, coordinates of the illuminated organic light emitting configurations 121 in the first row are successively set as (1,1), (1,21), (1,41) . . . ; coordinates of the illuminated organic light emitting configurations 121 in the second row are successively set as (19,11), (19,31), (19,51) . . . ; coordinates of the illuminated organic light emitting configurations 121 in the third row are successively set as (37,1), (37,21), (37,41) . . . , and so on, thereby forming the coordinates of all the organic light emitting configurations 121 illuminated at the same time in one frame. Apparently, when the organic light emitting configurations 121 are illuminated, a row spacing between illuminated organic light emitting configurations 121 in different rows is reduced from 20 P to 18 P if a spacing between adjacent illuminated organic light emitting configurations 121 in each row is still 20 P. At this moment, the distance between the marginal organic light emitting configuration 121 located in different rows from the central organic light emitting configuration 121 and the central organic light emitting configuration 121 is $\sqrt{(10P)^2+(18P)^2} \approx 20.59$ P>20 P, which can meet the requirements for avoiding crosstalk.

The organic light emitting layer 120 of the display apparatus is divided transversely and longitudinally by having each illuminated organic light emitting configuration 121 as the central point. As a result, the organic light emitting layer 120 is divided into a plurality of identical bright regions 121b. Sizes of all the bright regions 121b are completely the same. Each bright region 121b includes one illuminated organic light emitting configuration 121 and a plurality of non-illuminated organic light emitting configurations 121a encircling the illuminated organic light emitting configuration 121. It should be noted that a corresponding region of the illuminated organic light emitting configuration 121, located at the edge of the organic light emitting layer 120, in the organic light emitting layer 120 is only part of the bright regions.

Taking the illuminated organic light emitting configuration 121 (19,51) as an example, the bright region 121b corresponding to the illuminated organic light emitting configuration 121 (19,51) is encircled by four non-illuminated organic light emitting configurations 121a. The coordinates of the four non-illuminated organic light emitting configurations 121a are (10,41), (10,61), (28,41) and (28,61) respectively. Apparently, the size of the bright region 121b in the row direction is 20 P, and the size in the column direction is 18 P. In other words, the number of the organic light emitting configurations forming the bright region 121b is 20*18=360. There is only one illuminated organic light emitting configuration (19,51) in the bright region 121b. that is to say, one organic light emitting configuration 121 is illuminated in every 360 organic light emitting configurations 121. Therefore, a density of the illuminated organic light emitting configurations in the bright region 121b is 1/360. Since the organic light emitting layer 120 is divided into a plurality of bright regions 121b, a density of the illuminated organic light emitting configurations 121 in one frame is 1/360. As can be seen, 20*18=360 frames need to be scanned to illuminate all the organic light emitting configurations 121 in the display apparatus. FIG. 9B only shows some organic light emitting configurations 121 illuminated at the same time and coordinates thereof, and non-illuminated organic light emitting configurations 121a at four vertexes of one bright region 121b and coordinates thereof.

Apparently, the hexagonal array scanning mode shown in FIG. 9B is better than the square array scanning mode shown in FIG. 9A.

Figure 10:
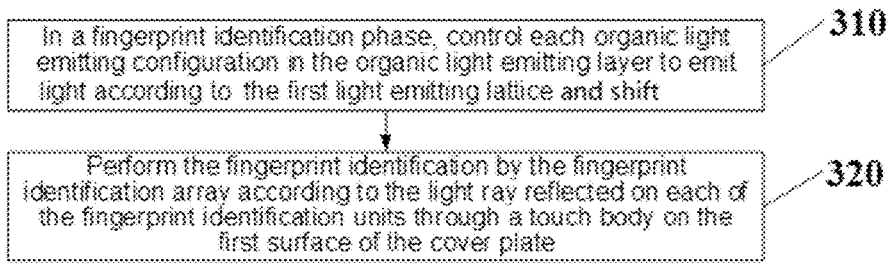
FIG. 10 is a flow chart illustrating a fingerprint identification method of a display apparatus provided by still another embodiment of the present disclosure.

Another embodiment of the present disclosure further provides a fingerprint identification method of a display apparatus. The display apparatus may be the display apparatus shown in above FIG. 1A to FIG. 1D and FIG. 3 to FIG. 8C, and includes: the display panel 100 and the cover plate 200 disposed on the display panel 100. The display panel 100 includes the array substrate 110, the organic light emitting layer 120 disposed at the side of the array substrate 110 facing the cover plate 200, and the fingerprint identification array 130. The organic light emitting layer 120 includes a plurality of organic light emitting configurations 121. The first surface of the cover plate 200 facing away from the array substrate 100 is the light emergent surface of the display apparatus. As shown in FIG. 10, the fingerprint identification method provided by the present embodiment includes steps described below.

In step 310, in the fingerprint identification phase, each organic light emitting configuration in the organic light emitting layer is controlled to emit light according to the first light emitting lattice and shift, where the distance between any two adjacent organic light emitting configurations in the first light emitting lattice is greater than or equal to a minimum crosstalk-free distance. The minimum crosstalk-free distance is a maximum radius of a covering region formed on the fingerprint identification array by the light emitted from any organic light emitting configuration and reflected through the first surface of the cover plate.

In step 320, the fingerprint identification is performed by the fingerprint identification array according to the light ray reflected on each of the fingerprint identification units by a touch body on the first surface of the cover plate. Optionally, the touch body in the present embodiment is the user's finger.

In the fingerprint identification method of the present embodiment performed by the display apparatus in a manner of screen scanning, each of the organic light emitting configurations in one screen emits light according to the first light emitting lattice and shifts. Since the distance between any two adjacent organic light emitting configurations in the first light emitting lattice is greater than or equal to the minimum crosstalk-free distance, the fingerprint reflection light formed by reflecting the light ray emitted from any organic light emitting configuration in the first light emitting lattice with the fingerprint of the finger of the user will not irradiate the fingerprint identification units corresponding to other organic light emitting configurations in the lattice. Therefore, each fingerprint identification unit can only receive the fingerprint reflection light formed by the light ray emitted from the organic light emitting configuration corresponding to the fingerprint identification unit in the first light emitting lattice. Namely, the fingerprint identification unit will not receive crosstalk signals from other organic light emitting configurations. Accordingly, the inductive signals generated by the fingerprint identification unit accurately indicates the reflection of the light ray emitted from the corresponding organic light emitting configuration on the fingerprint of the user's finger. Therefore, the display apparatus provided by the present embodiment improves the fingerprint identification precision.

In any of the above embodiments, the crosstalk existed in the fingerprint identification process is eliminated by defining the distance between any two adjacent organic light emitting configurations which emit light at the same time to be greater than or equal to the minimum crosstalk-free distance. Actually, embodiments of the present disclosure can also eliminate the crosstalk existed in the fingerprint identification process by improving the structure of the display apparatus.

Figure 11A:
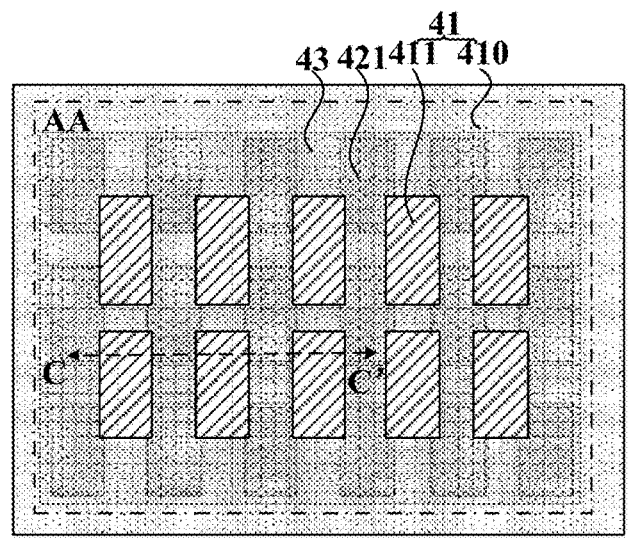
FIG. 11A is a top structural schematic diagram illustrating a display panel provided by an embodiment of the present disclosure.
Figure 11B:
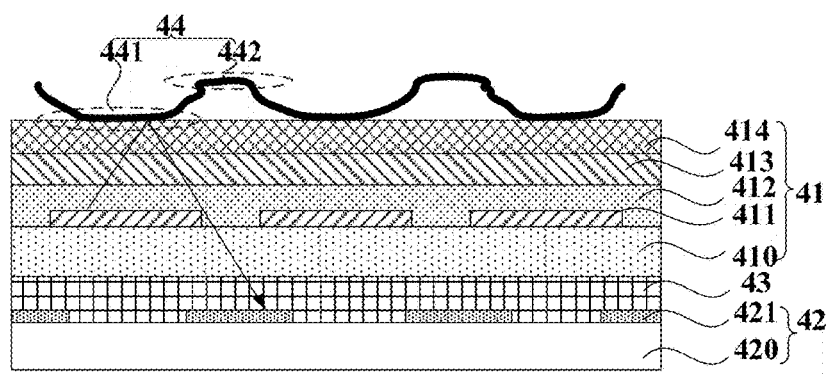
FIG. 11B is a cross sectional structural schematic diagram along line C-C' direction in FIG. 11A.

FIG. 11A is a top structural schematic diagram illustrating a display panel provided by embodiments of the present disclosure. FIG. 11B is a cross sectional structural schematic diagram along line C-C' direction in FIG. 11A. With reference to FIG. 11A and FIG. 11B, the display panel includes an organic light emitting display panel 41, a fingerprint identification module 42 and an angle limiting film 43. The organic light emitting display panel 41 includes an array substrate 410, and a plurality of organic light emitting configurations 411 disposed on the array substrate 410. The fingerprint identification module 42 is arranged in a display region AA at one side of the array substrate 410 facing away from the organic light emitting configurations 411, and includes a first substrate 420 and at least one fingerprint identification unit 421 disposed on the first substrate 420. The angle limiting film 43 is arranged between the organic light emitting display panel 41 and the fingerprint identification module 42.

The fingerprint identification module 42 is configured to perform fingerprint identification according to the light rays reflected on the fingerprint identification unit 421 through a touch body 44. The angle limiting film 43 is configured to filter out the following light rays among the light rays reflected on the fingerprint identification unit 421 through the touch body 44: the light rays that have an incident angle relative to the angle limiting film 43 greater than a penetration angle of the angle limiting film 43. The angle limiting film 43A may be set to have the transmittance of "A" for the light rays entering the angle limiting film 43 vertically. The penetration angle of the angle limiting film 43 means an incident angle of the light rays with the transmittance of "kA" relative to the angle limiting film 43, where 0<k<1. Light with an incident angle relative to the angle limiting film 43 greater than the penetration angle of the angle limiting film 43 is filtered out by the angle limiting film 43. Optionally, k is set to be equal to 0.1, namely the penetration angle of the angle limiting film 43 is an incident angle of the light ray with the transmittance of 0.1 A relative to the angle limiting film 43.

As shown in FIG. 11B, the light rays emitted from light sources irradiate the touch body 44. Corresponding to different light sources, the light rays may be the light ray indicated by solid lines shown in FIG. 11B or the light ray indicated by dotted lines shown in FIG. 11B. The fingerprint identification unit 421 can perform fingerprint identification according to the light rays emitted from any light source. Generally, the touch body 44 is a finger. In this case, the fingerprint is composed of a series of ridges 441 and valleys 442 on a skin surface of a finger tip. Since the distance from the ridges 441 to the fingerprint identification unit and the distance from the valleys 442 to the fingerprint identification unit are different, the intensity of light rays, which are reflected from the ridges 441, received by the fingerprint identification unit 421 and the intensity of light rays, which are reflected from the valleys 442, received by the fingerprint identification unit 421 are different. Accordingly, the current signal sensed from the reflected light formed at the ridges 441 and the current signal sensed from the reflected light formed at the valleys 442 are different in amplitudes. Therefore, fingerprint identification can be performed according to the amplitudes of the current signals. It should be noted that the touch body 44 can also be a palm and the like, and a palm print can also be used to realize detection and identification functions.

Optionally, the organic light emitting configurations 411 can provide light sources for the fingerprint identification module 42. The angle limiting film 43 is capable of filtering out the following light rays among the light rays emitted from the organic light emitting configurations 411 and reflected on the fingerprint identification unit 421 through the touch body 44: the light rays that have an incident angle relative to the angle limiting film 43 greater than a penetration angle of the angle limiting film 43. Therefore, the crosstalk phenomenon, which is caused by that the light rays emitted from the organic light emitting configurations 411 and reflected by different positions of the touch body 44 irradiate the same fingerprint identification unit 421, is effectively avoided, and the accuracy and precision for performing fingerprint identification by the fingerprint identification module is improved.

Optionally, when the light rays vertically reflected from the touch body 44 irradiate the fingerprint identification unit 421 after passing through the organic light emitting display panel 41, the transmittance of the light rays may be greater than 1%. Specifically, in the case that the fingerprint identification is performed by the fingerprint identification unit 421 according to the light rays emitted from the organic light emitting configurations 411, if the transmittance of the light rays is too small when the light rays vertically reflected from the touch body 44 irradiate the fingerprint identification unit 421 after passing through the organic light emitting display panel 41, the light rays have small intensity upon reaching the fingerprint identification unit 421. As a result, the fingerprint identification precision is influenced. Exemplarily, with respect to the light rays reflected vertically from the touch body 44, the transmittance of the light rays when the light rays irradiate the fingerprint identification unit 421 after passing through the organic light emitting display panel 41 can be adjusted by adjusting the thickness of each film through which the light rays pass.

Optionally, the display panel may include a light exiting side and a non-light exiting side. The light exiting side is a side of the organic light emitting configurations 411 facing away from the array substrate. The non-light exiting side is a side of the array substrate 410 facing away from the organic light emitting configurations 411. When the fingerprint identification is performed by the fingerprint identification units 421 according to the light rays emitted from the organic light emitting configurations 411, a ratio of the luminance at the light exiting side to the luminance at the non-light exiting side of the display panel may be greater than 10:1. The light rays on the non-light exiting side of the display panel may influence the fingerprint identification process which is performed by the fingerprint identification unit 421 according to the light rays emitted from the organic light emitting configurations 411 and reflected on the fingerprint identification unit 421 from the touch body 44, so that there exists the crosstalk for the light rays detected by the fingerprint identification unit. If the luminance of the non-light exiting side of the display panel is too great, the fingerprint identification precision may be seriously influenced.

Figure 12A:
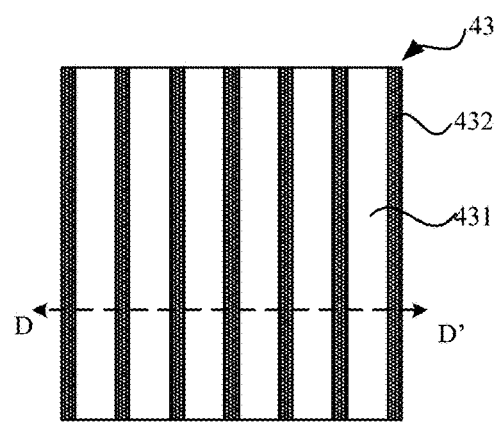
FIG. 12A is a top structural schematic diagram illustrating an angle limiting film provided by an embodiment of the present disclosure.
Figure 12B:
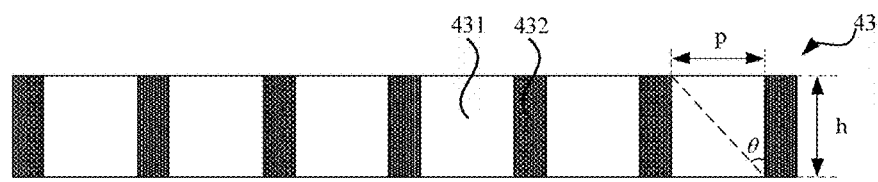
FIG. 12B is a cross sectional structural schematic diagram along line D-D' direction in FIG. 12A.

FIG. 12A is a top structural schematic diagram illustrating an angle limiting film provided by embodiments of the present disclosure. FIG. 12B is a cross sectional structural schematic diagram along line D-D' direction in FIG. 12A. With reference to FIG. 12A and FIG. 12B, the angle limiting film 43 includes a plurality of opaque regions 432 and a plurality of transparent regions 431. The plurality of opaque regions 432 and transparent regions 431 are parallel to a plane of the first substrate 420, and arranged at intervals along the same direction. The opaque regions 432 are provided with light absorbing materials. When the light rays irradiate the opaque regions 432, the light rays will be absorbed by the light absorbing materials in the opaque regions 432. In other words, a part of light reflected from the touch body 44 fails to pass through the angle limiting film 43 and irradiate the fingerprint identification unit 421, that is, the angle limiting film 43 can effectively filter out the part of light. As shown in FIG. 12B, since the light rays irradiating the opaque regions 432 are absorbed by the light absorbing materials in the regions, the penetration angle of the angle limiting film 43 meets the following formula: $\theta$=arctan p/h, where "$\theta$" is the penetration angle of the angle limiting film 43; "p" is the width of each the transparent region 431 in an arrangement direction of the transparent regions 431; and "h" is the thickness of the angle limiting film 43. It can be seen from FIG. 12B that $\theta$, p and h meet a computation relationship of tan $\theta$=p/h. Therefore, the penetration angle of the angle limiting film 43 meets the above formula. Since the light rays irradiating the opaque regions 432 will be absorbed by the light absorbing materials in such regions, light rays with an incident angle relative to the angle limiting film 43 greater than the computed penetration angle can be filtered out by the angle limiting film 43. Such part of light rays are required for the fingerprint identification. The arrangement of the angle limiting film 43 can prevent the light rays with an incident angle relative to the angle limiting film 43 greater than the penetration angle of the angle limiting film 43 from irradiating the fingerprint identification unit 421, thereby avoiding an interference to the fingerprint identification process.

Optionally, in the case that the angle limiting film 43 includes a plurality of opaque regions 432 and transparent regions 431 parallel to the plane of the first substrate 420 and arranged at intervals along the same direction, and the opaque regions 432 are provided with the light absorbing materials, a diffusion distance of the angle limiting film 43 meets the following formula:

$$\Delta X = \frac{p \cdot (H+h)}{h},$$

where $\Delta X$ is the diffusion distance of the angle limiting film 43; and "H" is the thickness of the organic light emitting display panel 41. The diffusion distance of the angle limiting film 43 means a distance between the following two reflection points on the touch body 44: the reflection point of the actual detection light rays corresponding to a fingerprint identification unit 421, and the reflection point of interference detection light rays corresponding to the same fingerprint identification unit 421. A reflected light ray with a minimum incident angle relative to the fingerprint identification unit 421 is the actual detection light ray. Compared with the incident angle of the actual detection light ray relative to the fingerprint identification unit 421, a reflected light ray with greater incident angle relative to the fingerprint identification unit 421 is the interference detection light ray.

Figure 12C:
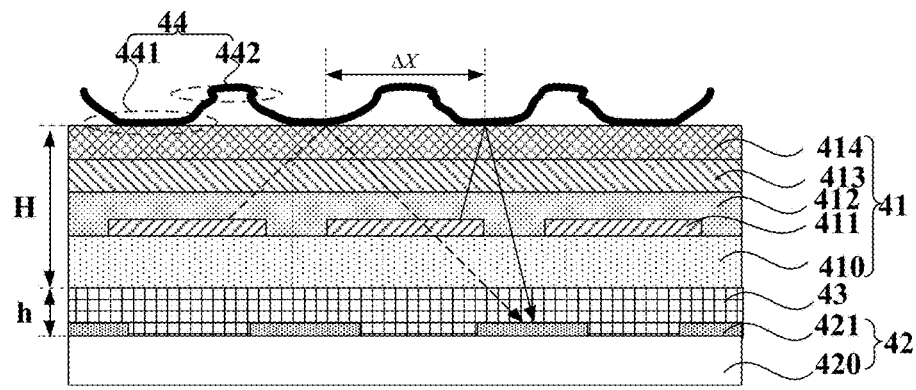
FIG. 12C is a cross sectional structural schematic diagram illustrating a display panel provided by an embodiment of the present disclosure.

Exemplarily, the light ray indicated by solid lines in FIG. 12C is the reflected light ray with the minimum incident angle relative to the fingerprint identification unit 421, i.e. the actual detection light ray, and the light ray indicated by dotted lines in FIG. 12C is the reflected light ray with a greater incident angle relative to the fingerprint identification unit 421 compared with the incident angle of the actual detection light ray relative to the fingerprint identification unit 421, i.e. the interference detection light ray. In the case that no angle limiting film 43 is arranged, the actual detection light ray and the interference detection light ray irradiate the same fingerprint identification unit 421 after being reflected from different positions of the touch body 44, such as two adjacent ridges 441. In other words, there exists crosstalk in the fingerprint identification process in the case.

Figure 12D:
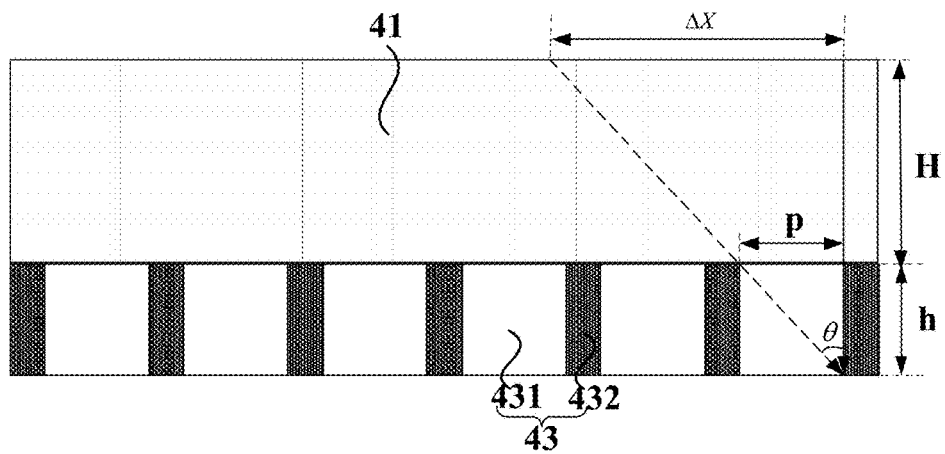
FIG. 12D is a geometrical relationship diagram illustrating a diffusion distance of the angle limiting film shown in FIG. 12A.

In this case, the diffusion distance of the angle limiting film 43 is a distance between the following reflection points on the touch body 44: the reflection point of the actual detection light ray shown in the FIG. 12C, and the reflection point of the interference detection light ray shown in the FIG. 12C. Exemplarily, as shown in FIG. 12D, the incident angle of the actual detection light ray relative to the fingerprint identification unit 421 is approximately 0°. As for the interference light rays that can pass through the angle limiting film 43, a minimum incident angle relative to the fingerprint identification unit 421 may be the penetration angle of the angle limiting film 43. Therefore, the following computation relationship is met $$\tan\theta = \frac{p}{h} = \frac{\Delta X}{H+h}.$$

Therefore, the diffusion distance of the angle limiting film 43 meets the above formula. The larger the diffusion distance of the angle limiting film 43 is, the lower the accuracy and the precision of fingerprint identification performed by the display panel are.

Figure 12E:
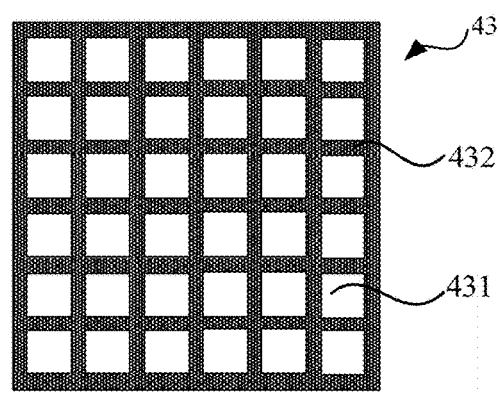
FIG. 12E is a top structural schematic diagram illustrating another angle limiting film provided by an embodiment of the present disclosure.

In FIG. 12A, the angle limiting film 43 is exemplarily configured as a one-dimensional structure in which the transparent regions 431 and the opaque regions 432 are arranged at intervals along the horizontal direction in FIG. 12A. However, the angle limiting film 43 can also be configured as a two-dimensional structure as shown in FIG. 12E. In this case, the transparent regions 431 and the opaque regions 432 are arranged at intervals along a diagonal direction of the angle limiting film 43 shown in FIG. 12E. Compared with the angle limiting film 43 of the one-dimensional structure, the angle limiting film 43 of the two-dimensional structure can selectively filter out the light rays being incident on the angle limiting film 43 in all directions.

Figure 13A:
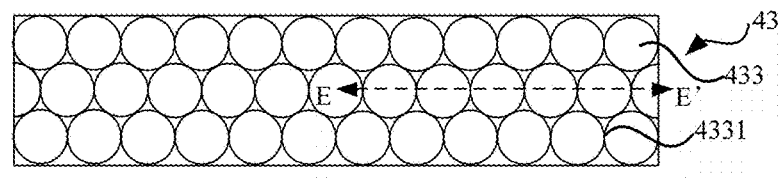
FIG. 13A is a top structural schematic diagram illustrating another angle limiting film provided by an embodiment of the present disclosure.
Figure 13B:
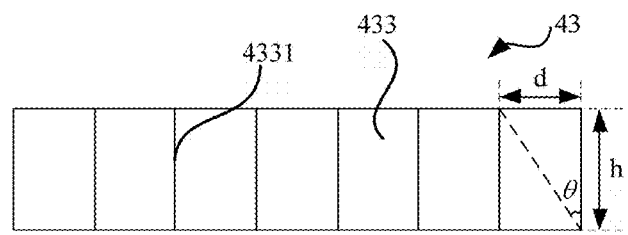
FIG. 13B is a cross sectional structural schematic diagram along line E-E' direction in FIG. 13A.

FIG. 13A is a top structural schematic diagram illustrating another angle limiting film provided by embodiments of the present disclosure. FIG. 13B is a cross sectional structural schematic diagram along line E-E' in FIG. 13A. With reference to FIG. 13A and FIG. 13B, the angle limiting film includes porous configurations 433. The light rays incident on a side wall 4331 of each of the porous configurations 433 are absorbed by the side wall 4331. In other words, the light rays incident on the side wall 4331 fail to irradiate the fingerprint identification unit 421. Exemplarily, the porous configuration 433 may be a glass capillary. The side wall 4331 of the glass capillary is coated with black light absorbing materials, and thus the side wall 4331 can absorb the light rays incident on the side wall 4331, thereby filtering out a part of light rays by the angle limiting film 43. Optionally, the light absorbing materials may be or may not be arranged between adjacent porous configurations 433.

Specifically, since the light rays incident on the side wall 4331 are absorbed by the side wall 4331 of the porous configuration 433, the penetration angle of the angle limiting film 43 meets the following formula:

$$\theta = \arctan\frac{d}{h},$$

where "θ" is the penetration angle of the angle limiting film 43; "d" is a diameter of the porous configuration 433; and "h" is the thickness of the angle limiting film 43. It can be seen from FIG. 13B that "θ", "d" and "h" comply with a computation relationship of $$\tan\theta = \frac{d}{h}.$$

Therefore, the penetration angle of the angle limiting film 43 meets the above formula.

Figure 13C:
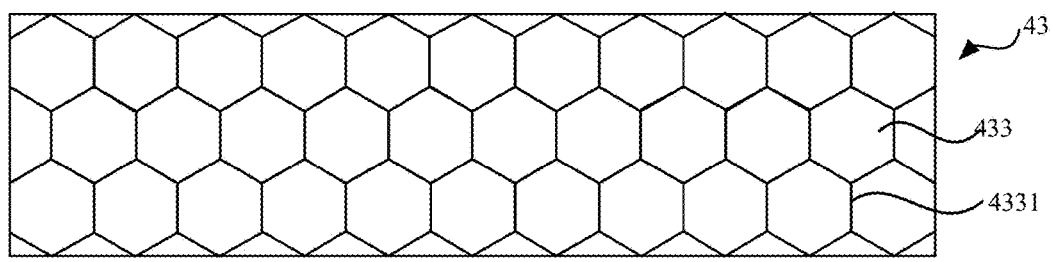
FIG. 13C is a top structural schematic diagram illustrating another angle limiting film provided by an embodiment of the present disclosure.

Optionally, when the angle limiting film 43 includes porous configurations 433 and the side wall 4331 of each of the porous configurations 433 can absorb the light rays incident on the side wall 4331, the diffusion distance of the angle limiting film 43 meets the following formula:

$$\Delta X = \frac{d \cdot (H + h)}{h},$$

where ΔX is the diffusion distance of the angle limiting film 43; and "H" is the thickness of the organic light emitting display panel 41. A derivation process of the formula is similar to the derivation process of the diffusion distance of the angle limiting film 43 with the structure shown in FIG. 12A, and is not repeated herein. Similarly, the larger the diffusion distance of the angle limiting film 43 is, the lower the accuracy and the precision of fingerprint identification performed by the display panel are. It should be noted that, when being viewed for the top, the porous configurations 433 of the angle limiting film 43 may have a circular shape as shown in FIG. 13A or an orthohexagonal shape as shown in FIG. 13C. Shapes of the porous configurations 433 are not limited in embodiments of the present disclosure.

Figure 14A:
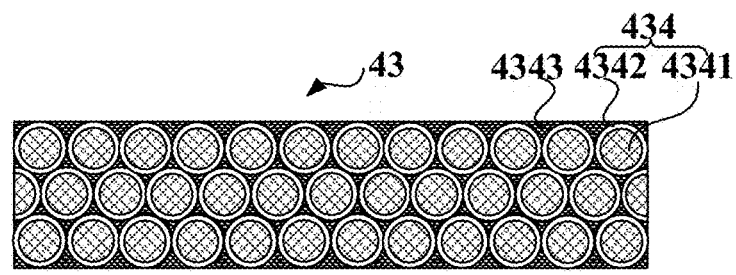
FIG. 14A is a top structural schematic diagram illustrating another angle limiting film provided by an embodiment of the present disclosure.
Figure 14B:
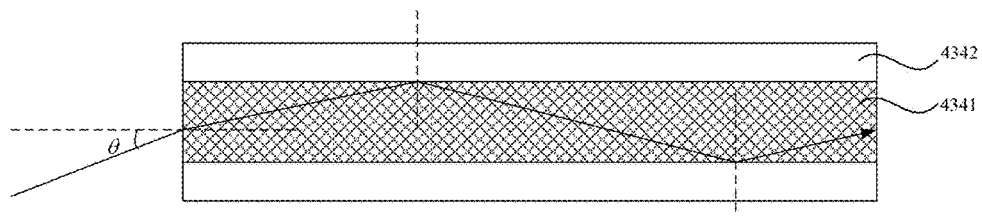
FIG. 14B is a cross sectional structural schematic diagram along an extension direction of optical fiber configurations in FIG. 14A.

FIG. 14A is a top structural schematic diagram illustrating another angle limiting film provided by embodiments of the present disclosure. As shown in FIG. 14A, the angle limiting film 43 includes a plurality of optical fiber configurations 434 arranged along the same direction. FIG. 14B is a cross sectional structural schematic diagram along an extension direction of the optical fiber configurations 434 in FIG. 14A. With reference to FIG. 14A and FIG. 14B, each of the optical fiber configurations 434 includes an inner core 4341 and an outer shell 4342. Light absorbing materials 4343 are provided between every two adjacent optical fiber configurations 434. Therefore, the light rays leaked to a region between two optical fiber configurations 434 from the optical fiber configuration 434 can be absorbed by the light absorbing materials 4343, so as to filtering out a part of the light rays by the angle limiting film 43.

Specifically, the inner core 4341 and the outer shell 4342 of the optical fiber configuration 434 have different refractive indexes. The penetration angle of the angle limiting film 43 meets the following formula: $n \cdot \sin\theta = \sqrt{n_{core}^2 - n_{clad}^2}$, where θ is the penetration angle of the angle limiting film 43; "n" is the refractive index of a film, which comes into contact with the angle limiting film 43, in the organic light emitting display panel 41; $n_{core}$ is the refractive index of the inner core 4341 of the optical fiber configuration 434; and $n_{clad}$ is the refractive index of the outer shell 4342 of the optical fiber configuration 434. As shown in FIG. 14B, if the incident angle, relative to the angle limiting film 43 formed with the optical fiber configurations 434, of the light rays reflected from the touch body 44 is greater than θ, a total reflection will not occurred to these light rays in the optical fiber configurations 434. In other words, these light rays can pass through the optical fiber configurations 434 and are absorbed by the light absorbing materials 4343 between the optical fiber configurations 434. As a result, such part of the light rays is filtered out by the angle limiting film 43, and fail to irradiate the fingerprint identification unit 421. Therefore, with the angle limiting film 43, the light rays with an incident angle relative to the angle limiting film 43 greater than the penetration angle of the angle limiting film 43 can be filtered out. The crosstalk phenomenon caused by that the light rays emitted from the fingerprint identification light sources irradiate the same fingerprint identification unit 421 after being reflected from different positions of the touch body 44 is avoided, and the accuracy and precision for fingerprint identification are improved.

Figure 14C:
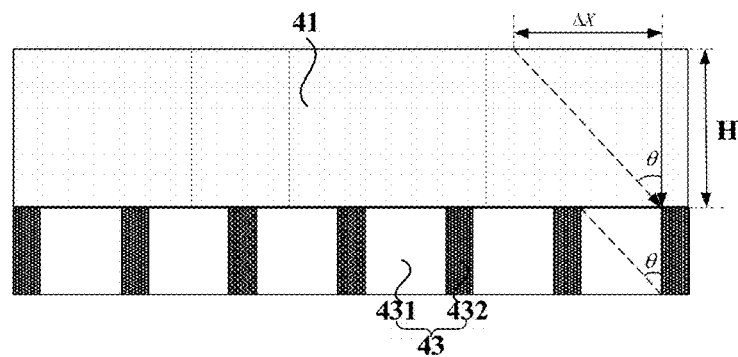
FIG. 14C is a geometrical relationship diagram illustrating a diffusion distance of an angle limiting film shown in FIG. 14A.

Optionally, in the case that the angle limiting film 43 includes a plurality of optical fiber configurations 434 arranged along the same direction, the inner core 4341 and the outer shell 4342 of the optical fiber configurations 434 have different refractive indexes, and light absorbing materials 4343 are provided between every two adjacent optical fiber configurations 434, the diffusion distance of the angle limiting film 43 meets the following formula: $\Delta X = H \cdot \tan\theta$, where ΔX is the diffusion distance of the angle limiting film 43; and "H" is the thickness of the organic light emitting display panel 41. As shown in FIG. 14C, the incident angle of the actual detection light ray relative to the fingerprint identification unit 421 is approximately 0°. As for the interference light rays that can pass through the angle limiting film 43, a minimum incident angle relative to the fingerprint identification unit 421 may be the penetration angle of the angle limiting film 43, i.e., a critical value of the incident angle at which the total reflection will occur to the light rays in the optical fiber configurations 434. Therefore, the following computation relationship is met $$\tan\theta = \frac{\Delta X}{H}.$$

Similarly, the larger the diffusion distance of the angle limiting film 43 is, the lower the accuracy and the precision of fingerprint identification performed by the display panel are.

Figure 15A:
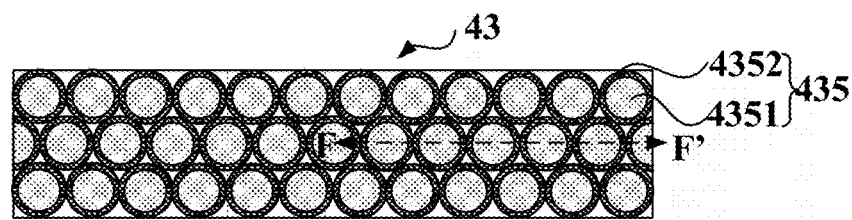
FIG. 15A is a top structural schematic diagram illustrating another angle limiting film provided by an embodiment of the present disclosure.
Figure 15B:
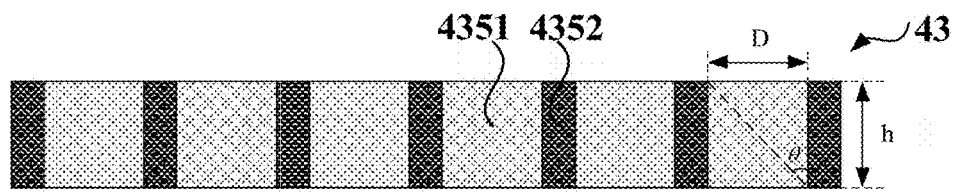
FIG. 15B is a cross sectional structural schematic diagram along line F-F' direction in FIG. 15A.

FIG. 15A is a top structural schematic diagram illustrating another angle limiting film provided by embodiments of the present disclosure. FIG. 15B is a cross sectional structural schematic diagram along line F-F' in FIG. 15A. With reference to FIG. 15A and FIG. 15B, the angle limiting film 43 includes a plurality of columnar configurations 435 arranged along the same direction. Each of the columnar configurations 435 includes an inner core 4351 and an outer shell 4352. The inner core 4351 and the outer shell 4352 have the same refractive index, and the outer shell 4352 includes light absorbing materials. Therefore, the light rays passing through the inner core 4351 and irradiating the outer shell 4352 are absorbed by the outer shell 4352. In other words, the light rays irradiating the outer shell 4352 fail to irradiate the fingerprint identification unit 421. Optionally, the light absorbing materials may be or may not be provided between adjacent columnar configurations 435.

Specifically, the light rays passing through the inner core 4351 and irradiating the outer shell 4352 are absorbed by the outer shell 4352. Therefore, the penetration angle of the angle limiting film 43 meets the following formula:

$$\theta = \arctan\frac{D}{h},$$

where θ is the penetration angle of the angle limiting film 43; "D" is the diameter of the inner core 4351; and "h" is the thickness of the angle limiting film 43. It can be seen from FIG. 15B that "θ", "D" and "h" comply with a computation relationship of $$\tan\theta = \frac{D}{h}.$$

Therefore, the penetration angle of the angle limiting film 43 meets the above formula.

Optionally, in the case that the angle limiting film 43 includes a plurality of columnar configurations 435 arranged along the same direction, each of the columnar configurations 435 includes the inner core 4351 and the outer shell 4352, the inner core 4351 and the outer shell 4352 have the same refractive index, and the outer shell 4352 includes the light absorbing materials, the diffusion distance of the angle limiting film 43 meets the following formula:

$$\Delta X = \frac{D \cdot (H + h)}{h},$$

where ΔX is the diffusion distance of the angle limiting film 43; and "H" is the thickness of the organic light emitting display panel 41. A derivation process of the formula is similar to the derivation process of the diffusion distance of the angle limiting film 43 with the structure shown in FIG. 12A, and is not repeated herein. The larger the diffusion distance of the angle limiting film 43 is, the lower the accuracy and the precision of fingerprint identification performed by the display panel are. It should be noted that, as viewed from the top of the angle limiting film 43, shapes of the columnar configurations 435 are not limited by embodiments of the present disclosure.

Optionally, the diffusion distance of the angle limiting film 43 is less than 400 μm. The larger the diffusion distance of the angle limiting film 43 is, the larger the distance between the following two reflection points on the touch body 44 is: the reflection point of the interference detection light rays on the touch body 44, and the reflection point of the actual detection light rays on the touch body 44. When the distance between the reflection points on the touch body 44 of the actual detection light rays and the interference detection light rays is greater than the distance between the valley 442 and an adjacent ridge 441 in the fingerprint, the fingerprint identification process of the display panel may have an error. As a result, the fingerprint identification cannot be performed, and the fingerprint identification accuracy of the display panel is seriously affected.

Optionally, the organic light emitting configuration 411 is configured to provide an light source for the fingerprint identification module 42. When the fingerprint identification is performed by the fingerprint identification units 421 according to the light rays emitted from the organic light emitting configurations 411 and then reflected on the fingerprint identification units 421 through the touch body 44, in the fingerprint identification phase, only one organic light emitting configuration 411 emits light within a range twice of the diffusion distance of the angle limiting film 43. Specifically, since only one organic light emitting configuration 411 emits light within a range twice of the diffusion distance of the angle limiting film 43, a probability that the light rays emitted from different organic light emitting configurations 411 are reflected to the same fingerprint identification unit 421 through different parts of the touch body 44 can be significantly reduced. Accordingly, a crosstalk phenomenon, caused by irradiating the same fingerprint identification unit 421 with the light emitted from the fingerprint identification light sources and then reflected through different parts of the touch body 44, is reduced, thereby improving accuracy and precision for fingerprint identification.

Optionally, an optical adhesive layer is arranged between the fingerprint identification module 42 and the angle limiting film 43, and is configured to bond the fingerprint identification module 42 and the angle limiting film 43. Optionally, the fingerprint identification unit 421 includes an optical fingerprint sensor configured to perform fingerprint detection and identification according to the light rays reflected through the touch body 44. Exemplarily, the fingerprint identification unit 421 includes light absorbing materials such as amorphous silicon or gallium arsenide or arsenic sulfide, or other light absorbing materials. The materials of the fingerprint identification unit 421 are not limited by embodiments of the present disclosure.

Optionally, as shown in FIG. 11B and FIG. 12C, the display panel may further include an encapsulating layer 412, a polarizer 413 and a cover glass 414 successively arranged on the organic light emitting configurations 411. The encapsulating layer 412 may include an encapsulating glass or a film encapsulating layer. The first substrate 420 as the substrate of the fingerprint identification unit 421 includes a glass base or a flexible base. The cover glass 414 may be bonded to the polarizer 413 with an optical adhesive. Optionally, the display panel further includes a touch electrode layer. The touch electrode layer is arranged between the encapsulating layer 412 and the polarizer 413, or between the cover glass 414 and the polarizer 413. The display panel integrated with the touch electrode can realize a touch function while displaying.

According to embodiments of the present disclosure, the angle limiting film 43 is arranged between the organic light emitting display panel 41 and the fingerprint identification module 42, and is capable of filtering out the following light rays among the light rays reflected on the fingerprint identification unit 421 through the touch body 44: the light rays with an incident angle relative to the angle limiting film 43 greater than the penetration angle of the angle limiting film 43. That is, the light rays reflected on the same fingerprint identification unit 421 through different parts of the touch body 44 in an existing art, can be selectively filtered out through the angle limiting film 43, thereby effectively avoiding the crosstalk phenomenon caused by irradiating the same fingerprint identification unit 421 with the light rays reflected through different parts of the touch body 44, and improving accuracy and precision for fingerprint identification.

Figure 16A:
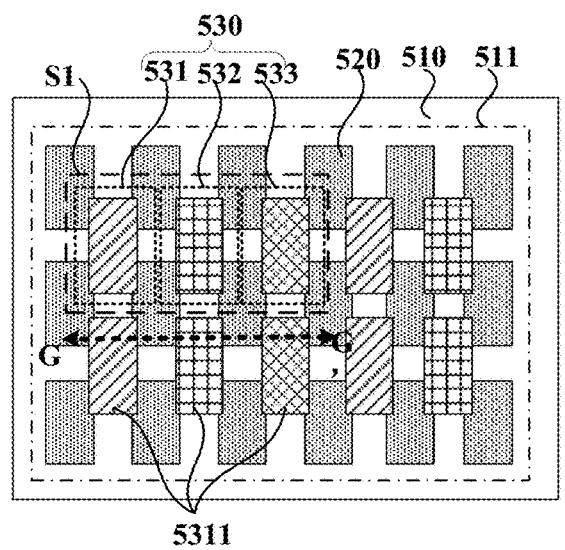
FIG. 16A is a top structural schematic diagram illustrating a touch display panel provided by an embodiment of the present disclosure.
Figure 16B:
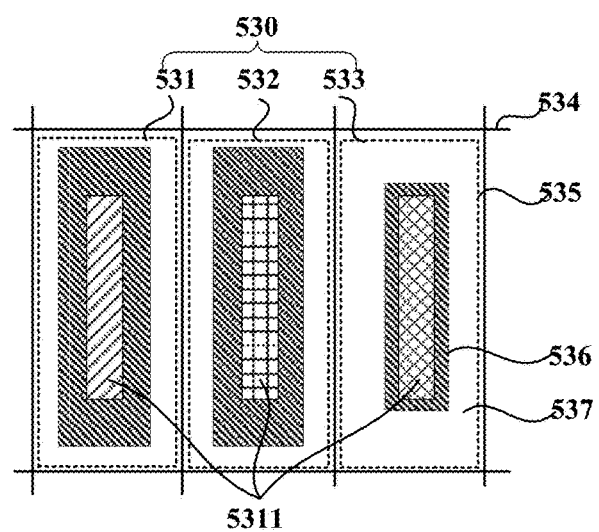
FIG. 16B is a local amplified schematic diagram illustrating S1 region in FIG. 16A.
Figure 16C:
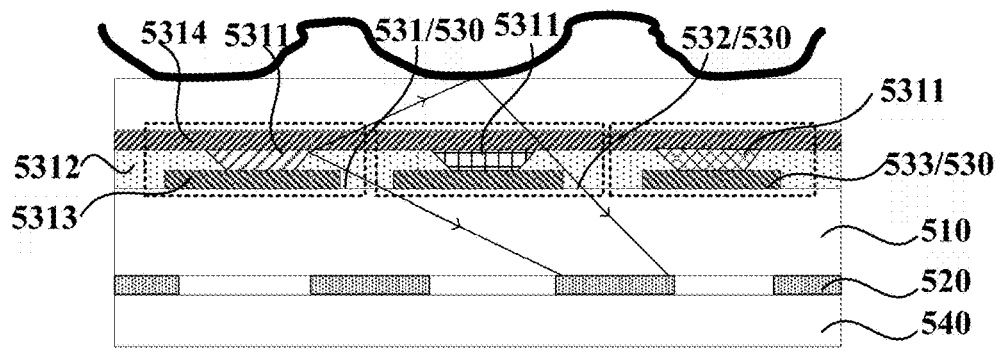
FIG. 16C is a cross sectional structural schematic diagram along line G-G' direction in FIG. 16A.

FIG. 16A is a top structural schematic diagram illustrating a touch display panel provided by embodiments of the present disclosure. FIG. 16B is a local amplified schematic diagram illustrating S1 region in FIG. 16A. FIG. 16C is a cross sectional structural schematic diagram along line G-G' in FIG. 16A. With reference to FIG. 16A to FIG. 16C, the touch display panel provided by embodiments of the present disclosure includes an array substrate 510, a plurality of organic light emitting configurations 530 and at least one fingerprint identification unit 520. The plurality of organic light emitting configurations 530 are disposed on the array substrate 510. The fingerprint identification unit 520 is arranged in a display region 511 at a side close to the array substrate 510 of the organic light emitting configurations 530. The fingerprint identification unit 520 is configured to perform fingerprint identification according to the light rays reflected on the fingerprint identification unit 520 through the touch body (such as a finger). The organic light emitting configurations 530 include a red organic light emitting configuration 531, a green organic light emitting configuration 532 and a blue organic light emitting configuration 533. In the fingerprint identification phase, the red organic light emitting configuration 531 and/or the green organic light emitting configuration 532 are served as light sources of the fingerprint identification unit 520 to emit light. Compared with the blue organic light emitting configuration 533, the red organic light emitting configuration 531 and/or the green organic light emitting configuration 532 as the light sources of the fingerprint identification unit 520 has a smaller photic area on a side facing away from the display side of the touch display panel. It should be noted that the number of the organic light emitting configurations and the arrangement of the red organic light emitting configuration, the green organic light emitting configuration and the blue organic light emitting configuration in the organic light emitting configurations are not limited by embodiments of the present disclosure.

Exemplarily, with reference to FIG. 16B and FIG. 16C, each organic light emitting configuration 530 successively includes a first electrode 5313, a light emitting functional layer 5311 and a second electrode 5314 along a direction in which the organic light emitting configuration 530 is away from the array substrate 510. The organic light emitting configurations 530 include the red organic light emitting configuration 531, the green organic light emitting configuration 532 and the blue organic light emitting configuration 533. The organic light emitting configurations 530 include the light emitting functional layer 5311. A transparent region 537 and an opaque region 536 are arranged in a direction facing away from the display side of the touch display panel. As for a top-emitting type touch display panel, the display side of the touch display panel is arranged in the direction in which the organic light emitting configurations 530 is away from the array substrate 510. The light emitting functional layer 5311 may include a first auxiliary functional layer, a light emitting material layer and a second auxiliary functional layer. The first auxiliary functional layer is a hole type auxiliary functional layer. The second auxiliary functional layer is an electronic type auxiliary functional layer. In the present embodiment, the first electrode 5313 is provided as an anode, and the second electrode 5314 is provided as a cathode. In other embodiments, the first electrode 5313 may be provided as the cathode, and the second electrode 5314 may be provided as the anode.

In the touch display panel provided by embodiments of the present disclosure, in a light emitting display phase, the red organic light emitting configuration, the green organic light emitting configuration and the blue organic light emitting configuration emit light according to preset modes. In the fingerprint identification phase, the red organic light emitting configurations and/or the green organic light emitting configurations are served as light sources of the fingerprint identification unit to emit light based on the following reasons: the light rays emitted from the blue organic light emitting configurations have a shorter wavelength, while each film (the organic insulation layer, the inorganic insulation layer, the polarizer and the like) in the display panel has a stronger absorption effect on the light rays with the shorter wavelength, and thus the light rays emitted from the blue organic light emitting configurations have a lower transmittance. Moreover, compared with the blue organic light emitting configurations, the red organic light emitting configurations and/or the green organic light emitting configurations as the light sources of the fingerprint identification unit have a smaller photic area on a side facing away from the display side of the touch display panel. Since the organic light emitting configurations as the light sources have a smaller photic area, stray light directly irradiating the fingerprint identification unit without being reflected through the touch body (such as the finger) is reduced. Only light rays reflected through the touch body carry the fingerprint information, while the light rays (stray light) directly irradiating the fingerprint identification unit without being reflected through the touch body do not carry the fingerprint information. In the embodiments of the present disclosure, the noise in fingerprint detection is reduced by reducing the stray light, and the fingerprint identification precision is improved.

Optionally, with reference to FIG. 16C, the touch display panel further includes a first substrate 540. The first substrate 540 is arranged at a side of the array substrate 510 facing away from the organic light emitting configurations 530. The fingerprint identification units 520 are arranged between the array substrate 510 and the first substrate 540. The fingerprint identification unit 520 and the first substrate 540 may be used as a part of the fingerprint identification module. The fingerprint identification module may further include some metal connection wires and an IC driving circuit (not shown in the figure).

Optionally, with reference to FIG. 16B and FIG. 16C, the first electrode 5313 is a reflection electrode. For example, the reflection electrode is configured to include an indium tin oxide conductive film, a reflection electrode layer (Ag) and an indium tin oxide conductive film successively arranged. The indium tin oxide conductive films are high-work-function materials and are beneficial to hole injection. The light emitting functional layer 5311 of the red organic light emitting configuration 531, the light emitting functional layer 5311 of the green organic light emitting configuration 532 and the light emitting functional layer 5311 of the blue organic light emitting configuration 533 are spaced by a pixel defining layer 5312. Exemplarily, both the red organic light emitting configuration 531 and the green organic light emitting configuration 532 are served as the light sources during fingerprint identification. The areas of the first electrode 5313 of the red organic light emitting configuration 531 and the green organic light emitting configuration 532 are greater than the area of the first electrode 5313 of the blue organic light emitting configuration 533. The light rays emitted from the light emitting functional layer 5311 in the organic light emitting configurations 530 to the array substrate 510 side are blocked by the first electrode 5313 disposed between the light emitting functional layer 5311 and the fingerprint identification unit 520, and the reflection electrodes of the red organic light emitting configurations 531 and the green organic light emitting configurations 532 as the light sources of the fingerprint identification unit 520 are extended compared with the existing art. Therefore, the stray light to irradiate the fingerprint identification unit 520 is blocked, and the fingerprint identification precision is improved. That is to say, compared with the existing art, the area of the reflection electrode in the blue organic light emitting configuration 533 is not changed, and the areas of the reflection electrode in the red organic light emitting configuration 531 and the green organic light emitting configuration 532 are increased, so as to block the stray light. In addition, the reflection electrode is adjacent to or in contact with the light emitting functional layer. Accordingly, the light rays emitted from the light emitting functional layer to the array substrate side are closer to the edge of the reflection electrode. Therefore, the reflection electrode may be extended by a certain distance to block the light rays emitted from the light emitting functional layer from directly irradiating the fingerprint identification unit. Moreover, if the reflection electrode is extended so that the stray light to irradiate the fingerprint identification unit is completely blocked, the fingerprint identification precision is significantly improved.

Optionally, with reference to FIG. 16B and FIG. 16C, a ratio of the area of the first electrodes 5313 of the organic light emitting configurations 530 as the light sources of the fingerprint identification units to the area of the light emitting functional layers 5311 is 1.2~6, and a ratio of the area of the first electrodes 5313 of the organic light emitting configurations 530 which are not served as the light sources of the fingerprint identification units 520 to the area of the light emitting functional layer 5311 is 1~1.2. Exemplarily, the red organic light emitting configurations 531 and the green organic light emitting configurations 532 are served as the light sources of the fingerprint identification units. The opaque region 536 in FIG. 16B is a vertical projection of the first electrode 5313 of the organic light emitting configuration 530 on the array substrate 510. It can be seen that, compared with the ratio of the area of the opaque region 536 in the blue organic light emitting configuration 533 to the area of the light emitting functional layer 5311, the ratio of the area of the opaque region 536 (the area of the first electrode) in the red organic light emitting configuration 531 and the green organic light emitting configuration 532 to the area of the light emitting functional layer 5311 is larger. When the ratio of the area of the first electrode of the organic light emitting configurations as the light sources of the fingerprint identification units to the area of the light emitting functional layer is set as 1.2~6, the first electrode can effectively prevent the light rays emitted from the light emitting functional layer from directly irradiating the fingerprint identification unit. Therefore, the stray light can be effectively blocked, thereby reducing the fingerprint detection noise and improving the fingerprint identification precision. It can be understood that, the larger the ratio of the area of the first electrode of the organic light emitting configurations as the light sources of the fingerprint identification units to the area of the light emitting functional layer is, the more effective the blocking of the first electrode for the stray light is. When the ratio of the area of the first electrode of the organic light emitting configurations as the light sources of the fingerprint identification units to the area of the light emitting functional layer is 6, the first electrode can just block most of the stray light, thereby significantly improving the fingerprint identification precision.

Figure 16D:
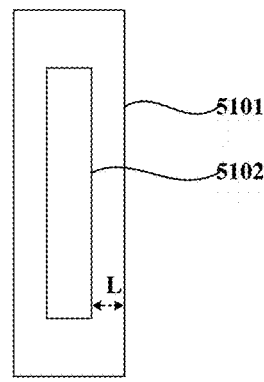
FIG. 16D is a schematic diagram illustrating a distance range between a first closed coil and a second closed coil.

Optionally, with reference to FIG. 16C to FIG. 16D, the vertical projection of the edge of the first electrode 5313 of the organic light emitting configurations 530 as the light sources of the fingerprint identification units 520 on the array substrate 510 forms a first closed coil 5101, and the vertical projection of the edge of the light emitting functional layer 5311 on the array substrate 510 forms a second closed coil 5102. FIG. 16D is a schematic diagram illustrating a distance range between the first closed coil and the second closed coil. With reference to FIG. 16D, the first closed coil 5101 encircles the second closed coil 5102. For any point on the first closed coil 5101, there exists a corresponding point, the distance between which and that point on the first closed coil 5101 is the shortest distance L, on the second closed coil 5102. The distance range between the first closed coil 5101 and the second closed coil 5102 is a set of the shortest distances L with respect to all points on the first closed coil 5101. The distance range between the first closed coil 5101 and the second closed coil 5102 is 3~30 μm. The distance range between the first closed coil 5101 and the second closed coil 5102 represents an extension degree of the first electrode within a plane of the first electrode in any direction. When the distance range between the first closed coil 5101 and the second closed coil 5102 is 3~30 μm, the first electrode can effectively block the stray light, thereby improving the fingerprint identification precision.

Figure 16E:
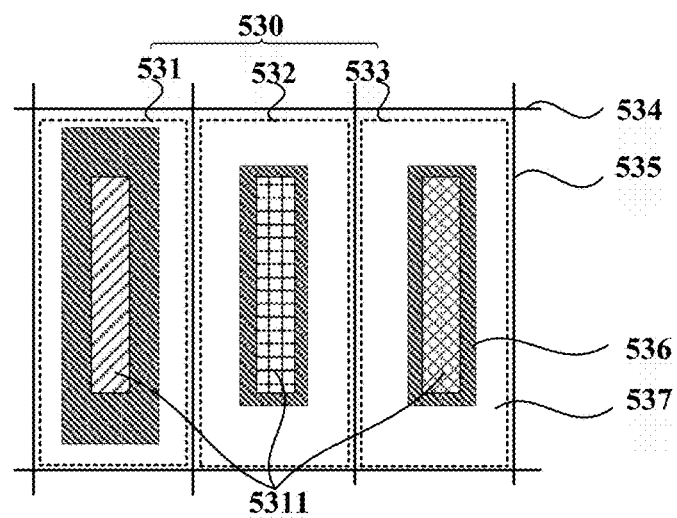
FIG. 16E is a local amplified schematic diagram illustrating another S1 region provided by an embodiment of the present disclosure.

FIG. 16E is a local amplified schematic diagram illustrating another S1 region provided by embodiments of the present disclosure. As shown in FIG. 16E, compared with the photic area of the blue organic light emitting configuration 533 towards a side facing away from the display side of the touch display panel, the photic area of the red organic light emitting configuration 531 as the light source of the fingerprint identification unit towards the side facing away from the display side of the touch display panel is smaller. Moreover, compared with the photic area of the green organic light emitting configuration 532 towards the side facing away from the display side of the touch display panel, the photic area of the red organic light emitting configuration 531 as the light source of the fingerprint identification unit towards the side facing away from the display side of the touch display panel is smaller. Since only the red organic light emitting configuration is served as the light source for fingerprint identification, it only needs to block the light rays emitted from the light emitting functional layer in the red organic light emitting configuration towards the side facing away from the display side of the touch display panel. For example, only the first electrode in the red organic light emitting configuration needs to be designed to be extended, and the green organic light emitting configuration and the blue organic light emitting configuration are not required to have additional configurations. In addition, the photic areas of the green organic light emitting configuration and the blue organic light emitting configuration are both larger than the photic area of the red organic light emitting configuration as the light source. Therefore, such arrangement not only ensures the fingerprint identification precision, but also ensures enough photic area through which signal light reflected through the touch body (such as the finger) passes, so as to improve the intensity of the signal light for detection on the fingerprint identification unit. In addition, an operating voltage of the red organic light emitting configuration can also be properly increased to improve the intensity of the light emitted from the light source, so as to improve the intensity of the signal light for detection on the fingerprint identification unit. Alternatively, in other embodiments, only the green organic light emitting configuration is served as the light source for fingerprint identification. Moreover, compared with the photic area of the blue organic light emitting configuration towards the side facing away from the display side of the touch display panel as well as the photic area of the red organic light emitting configuration towards the side facing away from the display side of the touch display panel, the photic area of the green organic light emitting configuration towards the side facing away from the display side of the touch display panel is smaller.

Figure 17:
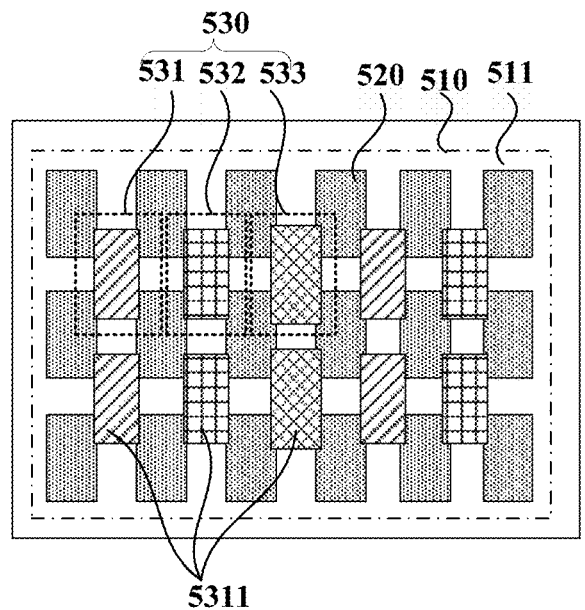
FIG. 17 is a top structural schematic diagram illustrating another touch display panel provided by an embodiment of the present disclosure.

FIG. 17 is a top structural schematic diagram illustrating another touch display panel provided by embodiments of the present disclosure. Optionally, as shown in FIG. 17, the area of the light emitting functional layer of the blue organic light emitting configuration 533 is greater than the area of light emitting functional layer of the red organic light emitting configuration 531, and is greater than the area of light emitting functional layer of the green organic light emitting configuration 532. The area of the light emitting functional layer of the blue organic light emitting configuration is prepared to be greater, so that the light emitting functional layer of the blue organic light emitting configuration is operated at low voltage. Exemplarily, for example, the operating voltage of the light emitting functional layer of the red organic light emitting configuration and the green organic light emitting configuration may be set as 3V, and the operating voltage of the light emitting functional layer of the blue organic light emitting configuration is set as 2V, so as to prolong the service life to reach a balance in the service life of the red organic light emitting configuration, the green organic light emitting configuration and the blue organic light emitting configuration, thereby prolonging the service life of the entire touch display panel.

Figure 18A:
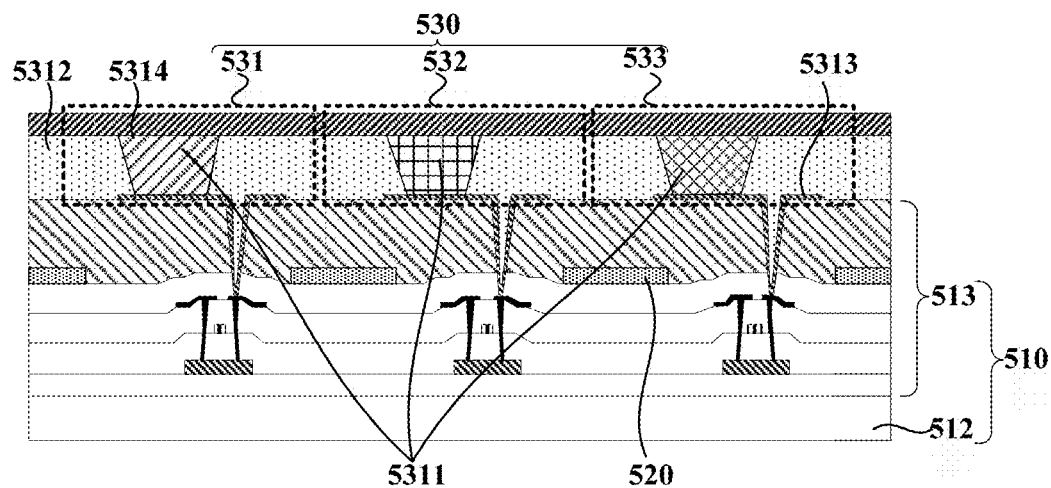
FIG. 18A is a cross sectional structural schematic diagram illustrating another touch display panel provided by an embodiment of the present disclosure.
Figure 18B:
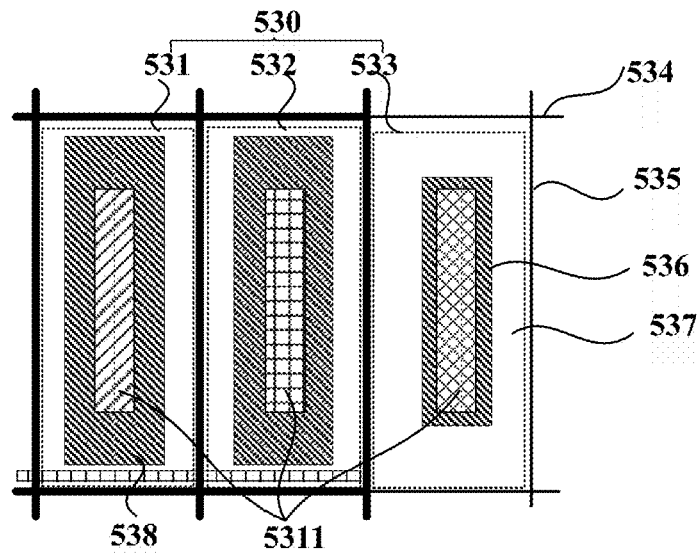
FIG. 18B is a local amplified schematic diagram illustrating another S1 region provided by an embodiment of the present disclosure.

FIG. 18A is a cross sectional structural schematic diagram illustrating another touch display panel provided by embodiments of the present disclosure. FIG. 18B is a local amplified schematic diagram illustrating another S1 region provided by the embodiment of the present disclosure. Optionally, with reference to FIG. 18A, the array substrate 510 includes a second substrate 512 and a plurality of pixel driving circuits 513 disposed on the second substrate 512. Each pixel driving circuit 513 is electrically connected with a corresponding organic light emitting configuration 530. The fingerprint identification unit 520 is arranged between the second substrate 512 and the organic light emitting configuration 530. Three pixel driving circuits 513 are exemplarily provided in FIG. 18A. Each pixel driving circuit 513 is electrically connected with the first electrode 5313 in the organic light emitting configuration 530 respectively. The fingerprint identification module formed by the fingerprint identification unit 520, the metal connection wire and the IC driving circuit (not shown in the figure) is embedded into the touch display panel. In the present embodiment of the present disclosure, since the fingerprint identification module is embedded into the touch display panel, the thickness of the display panel is reduced and thinning design of the touch display panel is realized.

Optionally, the area of the vertical projection of the pixel driving circuit 513, which corresponds to the organic light emitting configuration 530 as the light source of the fingerprint identification unit 520, on the second substrate 512 is greater than an area of the vertical projection of the pixel driving circuit 513, which corresponds to the organic light emitting configuration 530 not served as the light source of the fingerprint identification unit 520, on the second substrate 512. The fingerprint identification unit 520 is arranged between the pixel driving circuits 513 and the second substrate 512.

With reference to FIG. 18A and FIG. 18B, in the organic light emitting configurations as the light sources of the fingerprint identification, a scanning line 534 and a data line 535 in the pixel driving circuit 513 can be designed to be widened, so as to block the stray light. To be sure, to block the stray light on the basis of not influencing original functions, locations or sizes of opaque elements in the pixel driving circuit 513 can also be changed. For example, the location of a capacitor metal plate 538 is changed so as to block the stray light on the basis of an original capacitor storage function.

Figure 18C:
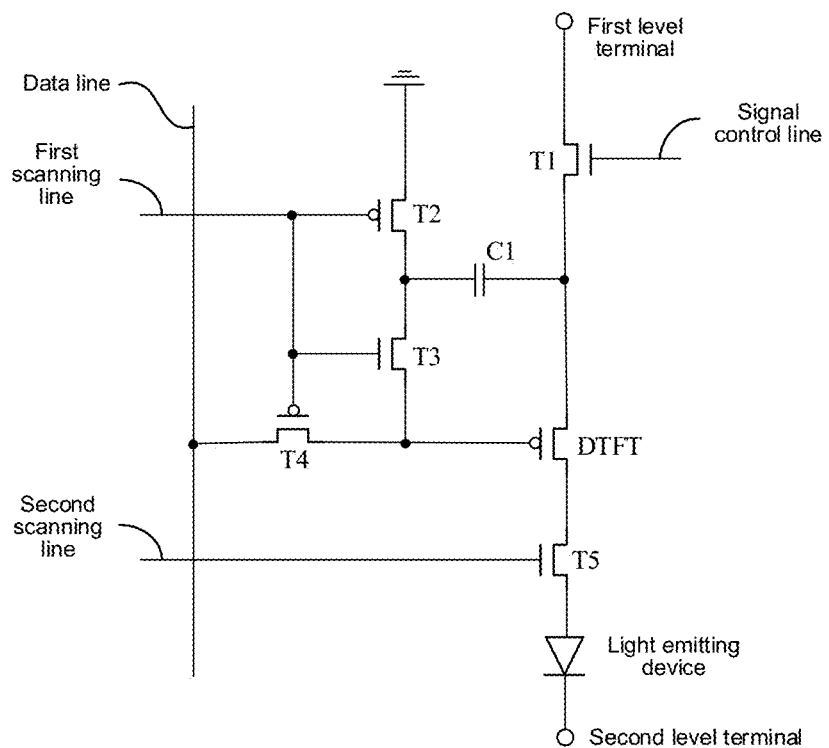
FIG. 18C is a schematic circuit diagram illustrating a pixel driving circuit provided by an embodiment of the present disclosure.
Figure 18D:
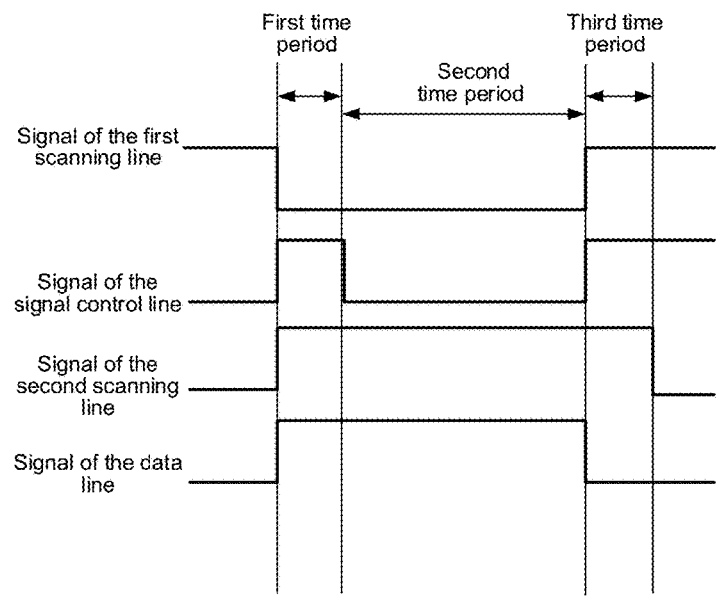
FIG. 18D is a schematic diagram illustrating a signal time sequence state of a pixel driving circuit provided by an embodiment of the present disclosure.

FIG. 18C is a schematic circuit diagram illustrating a pixel driving circuit provided by embodiments of the present disclosure. FIG. 18D is a schematic diagram illustrating a signal time sequence state of the pixel driving circuit provided by embodiments of the present disclosure. The scanning line 534 in FIG. 18D may be a signal control line, a first scanning line and a second scanning line in the pixel driving circuit provided by embodiments of the present disclosure. The data line 535 in FIG. 18D may be a data line in the pixel driving circuit provided by embodiments of the present disclosure. The capacitor metal plate 538 in FIG. 18D may be a storage capacitor C1 in the pixel driving circuit provided by embodiments of the present disclosure. It can be understood that Gates, sources and other opaque parts of a first thin film transistor T1 and a second thin film transistor T2 in the pixel driving circuit can also be used to block the stray light. With reference to FIG. 18C and FIG. 18D, a pixel driving circuit provided by embodiments of the present disclosure includes a data line, a first scanning line, a second scanning line, a signal control line, a light emitting device, a storage capacitor C1, a driving transistor DTFT and four switching transistors (T1~T4). The gate of the first switching transistor T1 is connected with the signal control line; the source of the first switching transistor T1 is connected with a first level terminal; and the drain of the first switching transistor T1 is connected with a first electrode of the storage capacitor C1. The gate of the second switching transistor T2 is connected with the first scanning line; the source of the second switching transistor T2 is grounded; and a drain of the second switching transistor T2 is connected with a second electrode of the storage capacitor C1. The gate of the third switching transistor T3 is connected with the first scanning line; and the source of the third switching transistor T3 is connected with the second electrode of the storage capacitor C1. The gate of the fourth switching transistor T4 is connected with the first scanning line; the source of the fourth switching transistor T4 is connected with the data line; and a drain of the fourth switching transistor T4 is connected with the drain of the third switching transistor T3. The gate of the driving transistor DTFT is connected with the drain of the fourth switching transistor T4; and the source of the driving transistor DTFT is connected with the first electrode of the storage capacitor C1. The gate of the fifth switching transistor T5 is connected with the second scanning line; the source of the fifth switching transistor T5 is connected with the drain of the driving transistor DTFT; the drain of the fifth switching transistor T5 is connected with one end of the light emitting device; and the other end of the light emitting device is connected with the second level terminal.

The first switching transistor T1, the third switching transistor T3 and the fifth switching transistor T5 are "N" type switching transistors, and the driving transistor DTFT, the second switching transistor T2 and the fourth switching transistor T4 are "P" type switching transistors.

A driving method of the pixel driving circuit provided by embodiments of the present disclosure is as follows: in a first phase, the first switching transistor T1, the second switching transistor T2, the fourth switching transistor T4 and the fifth switching transistor T5 are turned on, the third switching transistor T31 is turned off, and the storage capacitor C1 is charged by the first level terminal; in a second phase, the second switching transistor T2, the fourth switching transistor T4 and the fifth switching transistor T5 are turned on, the first switching transistor T1 and the third switching transistor T31 are turned off, and the storage capacitor C1 discharges through the driving transistor DTFT until a difference between the voltage of the gate and the voltage of the source of the driving transistor DTFT is equal to a threshold voltage of the driving transistor DTFT; and in a third phase, the first switching transistor T1, the third switching transistor T31 and the fifth switching transistor T5 are turned on, the second switching transistor T2 and the fourth switching transistor T4 are turned off, and the first level terminal and the second level terminal exert conducting signals to the light emitting device. The fifth switching transistor T5 is turned off after the display is finished, thereby protecting the light emitting device.

Figure 19:
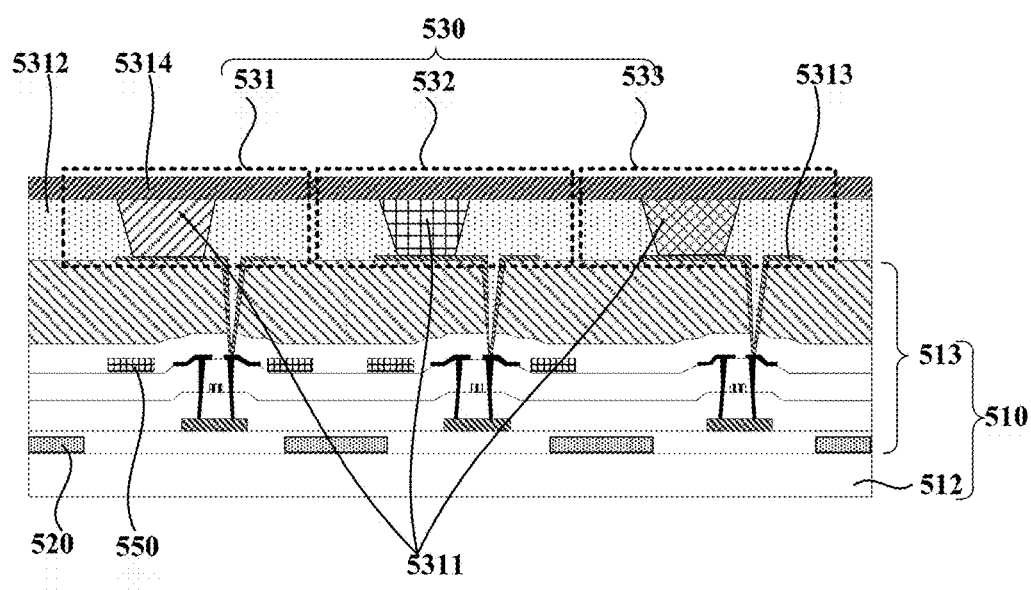
FIG. 19 is a cross sectional structural schematic diagram illustrating another touch display panel provided by an embodiment of the present disclosure.

FIG. 19 is a cross sectional structural schematic diagram illustrating another touch display panel provided by embodiments of the present disclosure. Optionally, with reference to FIG. 19, the array substrate 510 further includes a plurality of shading pads 550. The shading pads 550 are arranged between the fingerprint identification units 520 and the organic light emitting configurations 530 as the light sources of the fingerprint identification units 520. Each organic light emitting configuration 530 successively includes a first electrode 5313, a light emitting functional layer 5311 and a second electrode 5314 along a direction in which the organic light emitting configurations 530 is away from the array substrate 510. The first electrode 5313 is a reflection electrode. The area of the vertical joint projection of the shading pads 550 and the first electrode 5313 of the organic light emitting configurations 530 as the light sources of the fingerprint identification units 520 on the array substrate 510 is greater than the area of the vertical projection of the first electrode 5313 of the organic light emitting configurations 530 which is not served as the light sources of the fingerprint identification units 520 on the array substrate 510. The vertical joint projection of the first electrode 5313 and the shading pad 550 on the array substrate 510 is a union of the vertical projection of the first electrode 5313 on the array substrate 510 and vertical projections of the shading pads 550 on the array substrate 510. Specifically, if A and B are sets, then a union of A and B is a set including all elements of A and all elements of B and excluding other elements.

Optionally, with reference to FIG. 19, the vertical projection of the edge of the first electrode 5313 of the organic light emitting configurations 530, which are served as the light sources of the fingerprint identification unit 520, on the array substrate 510 is located in the vertical projections of the shading pads 550 on the array substrate 510. Through such arrangement, the reflection electrode is equivalent to be extended. That is, this is equivalent to that, compared with the existing art, the area of the reflection electrode in the blue organic light emitting configuration 533 is not changed, and the area of the reflection electrode in the red organic light emitting configuration 531 and/or the green organic light emitting configuration 532 is increased, so as to block the stray light. Embodiments of the present disclosure can effectively prevent the stray light from irradiating the fingerprint identification unit. The array substrate 510 includes a second substrate 512 and a plurality of pixel driving circuits 513 disposed on the second substrate 512. The pixel driving circuit 513 includes a data line, scanning lines and a capacitor metal plate (not shown). The shading pads 550 are arranged on the same layer as the data line, the scanning lines or the capacitor metal plate, thereby saving technological processes. The shading pads can be made without adding a metal layer in the touch display panel, thereby increasing manufacturing efficiency and saving the production cost.

The shading pads 550 may be made of metal materials, or non-metal materials with a shading effect. The shading pads are adopted to prevent the stray light from irradiating the fingerprint identification unit in embodiments of the present disclosure, so as to improve the fingerprint identification precision. It should be noted that solutions in above embodiments can be combined with each other to improve the fingerprint identification precision.

Figure 20:
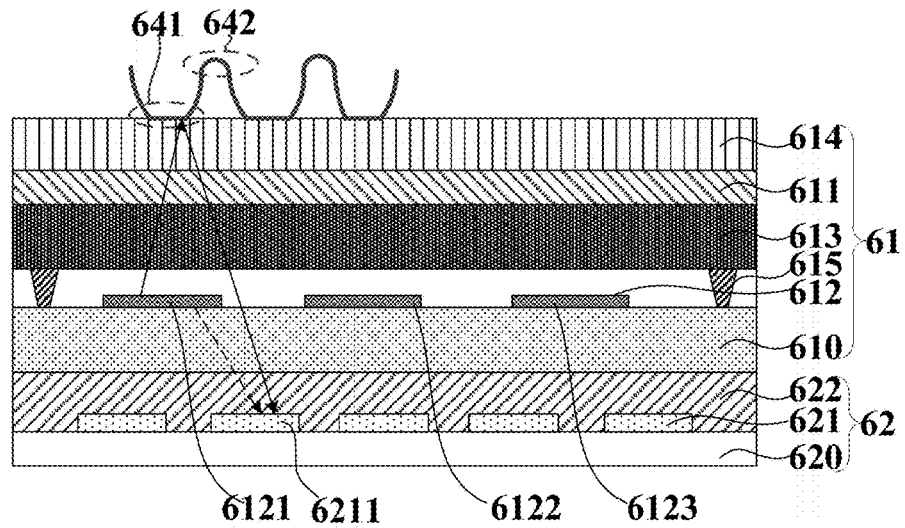
FIG. 20 is a cross sectional structural schematic diagram illustrating a display panel provided by an embodiment of the present disclosure.

FIG. 20 is a schematic cross sectional diagram illustrating a display panel provided by embodiments of the present disclosure. As shown in FIG. 20, the display panel in the present embodiment includes a display module 61 and a fingerprint identification module 62. The display module 61 includes a first substrate 610 and a first polarizer 611 disposed on the first substrate 610. A light emergent surface of the display module 61 is at a side of the first polarizer 611 facing away from the first substrate 610. The fingerprint identification module 62 is arranged at a side facing away from the first polarizer 611 of the first substrate 610, and includes a fingerprint identification layer 621 and a second polarizer 622 disposed at a side close to the display module 61 of the fingerprint identification layer 621. The fingerprint identification layer 621 is configured to perform fingerprint identification according to fingerprint signal light formed by the light rays emitted from the light sources and reflected on the fingerprint identification layer through the touch body. The display module 61 further includes an organic light emitting layer 612 arranged between the first substrate 610 and the first polarizer 611. The organic light emitting layer 612 is configured to generate light for displaying the pictures. Optionally, the organic light emitting layer 612 includes a red organic light emitting unit 6121, a green organic light emitting unit 6122 and a blue organic light emitting unit 6123. The above fingerprint identification layer 621 includes a plurality of fingerprint identification units 6211.

Optionally, in the present embodiment, the organic light emitting layer 612 is multiplexed as the above light source. Exemplarily, a plurality of organic light emitting units and a plurality of fingerprint identification units are arranged in an array. The fingerprint identification units may be arranged correspondingly to the organic light emitting units. Beams of fingerprint signal light generated by one organic light emitting unit as the light source can be received by one or more fingerprint identification units corresponding to the organic light emitting unit. Optionally, the display panel includes a display region. The organic light emitting unit and the fingerprint identification unit are located in the display region. Thus, fingerprint identification can be realized in the display region of the display panel.

With reference to FIG. 20, the light rays emitted from the organic light emitting layer 612 irradiate the touch body, and the touch body is usually a finger. The fingerprint is composed of a series of ridges 641 and valleys 642 on a surface of skin of a finger tip. Since intensities of light rays reflected by the ridges 641 and the valleys 642 received by the fingerprint identification unit are different, so that current signals sensed by the reflected light formed at the ridges 641 and the reflected light formed at the valleys 642 are different in sizes. Then, fingerprint identification can be performed according to the sizes of the current signals. It should be noted that the touch body can also be a palm and the like, and the fingerprint identification unit can realize detection and identification functions according to a palm print.

Considering that the above organic light emitting layer 612 is used as not only the light source for displaying pictures, but also the light source for fingerprint identification, whether in the display phase or in the fingerprint identification phase, the organic light emitting layer needs to emit light; or in the display phase, light emitting driving signals are input into all the organic light emitting units of the organic light emitting layer; and in the fingerprint identification phase, the light emitting driving signals are input into some organic light emitting units. Therefore, based on the above solution, the display module 61 in the present embodiment further includes a first display driving circuit (not shown in the figure) configured to output the light emitting driving signals for driving at least part of the organic light emitting units in the fingerprint identification phase, so as to provide light sources for the fingerprint identification module 62.

Exemplarily, in the fingerprint identification phase, the first display driving circuit outputs driving signals for driving the red organic light emitting unit and/or the green organic light emitting unit to emit light based on the following reasons: the light rays emitted from the blue organic light emitting unit have a shorter wavelength while each film (such as the organic insulation layer, the inorganic insulation layer, the polarizer and the like) in the display panel has a stronger absorption effect on the light rays with the shorter wavelength, and thus the light rays emitted from the blue organic light emitting unit have a lower transmittance and are easy to be absorbed by the touch display panel; and the material of the light emitting functional layer of the blue organic light emitting unit has a shorter life than the material of light emitting functional layer of the red organic light emitting unit and the blue organic light emitting unit. Optionally, the display panel in the present embodiment further includes a touch functional layer. The structure and position of the touch functional layer are not limited herein as long as a touch position on the screen can be detected. After the finger's touch position on the screen is detected, in the fingerprint identification phase, the first display driving circuit outputs driving signals for driving the organic light emitting units in regions corresponding to the finger's touch position on the screen to emit light.

Optionally, the first polarizer in the present embodiment includes a first linear polarizer; the second polarizer includes a second linear polarizer; and polarization directions of the first linear polarizer and the second linear polarizer are consistent.

Referring back to FIG. 20, the solid arrow indicates light rays emitted from the organic light emitting layer 612 to the light emergent surface and light rays of the fingerprint signal light formed after reflected through the touch body, and the dotted arrow indicates light rays leaked from the organic light emitting layer 612 to the fingerprint identification module 62. Light emitted from the organic light emitting layer, such as the red organic light emitting unit 6121 in FIG. 20, is firstly changed to linearly polarized light through the first polarizer 611. The linearly polarized light, after being reflected through the touch body, is still linearly polarized light (fingerprint signal light at this moment), and the polarization direction is not changed. Then, the fingerprint signal light passes through the first polarizer 611 again without any light intensity loss. Since the polarization direction of the second polarizer 622 and the polarization direction of the first polarizer 611 are consistent, when the fingerprint signal light passes through the second polarizer 622, the fingerprint signal light passes through the second polarizer 622 without any light intensity loss, and reaches the fingerprint identification unit 6211. However, the light leaked from the red organic light emitting unit 6121 is evenly distributed in each polarization direction, and is changed to light having only one polarization direction after passing through the second polarizer 622. As a result, half of the intensity of the light is lost. Therefore, when the light leaked from the organic light emitting unit reaches the fingerprint identification unit 6211, the light intensity is greatly reduced. In conclusion, the light intensity of the fingerprint signal light is not changed, while the light intensity of the fingerprint noise light is relatively reduced. Therefore, a signal-to-noise ratio of the fingerprint identification module 62 is increased, and thus the fingerprint identification precision of the fingerprint identification module 62 is improved.

Optionally, the display panel in the present embodiment is a rigid display panel. As shown in FIG. 20, the first substrate 610 is a first glass substrate. The display module 61 further includes a second glass substrate 613. The organic light emitting layer 612 is arranged between the first glass substrate 610 and the second glass substrate 613. The first glass substrate 610 and the second glass substrate 613 are supported by supporting pillars 615. An air gap exists between the first glass substrate 610 and the second glass substrate 613. Optionally, the thickness of the air gap is 4 µm. The display panel further includes a cover plate 614. Optionally, the thickness of the display module is 1410 µm. In the present embodiment, the fingerprint identification module 62 further includes a second substrate 620. The fingerprint identification layer 621 is arranged on a surface of a side close to the display module 61 of the second substrate 620. The second substrate 620 is configured to protect the fingerprint identification layer 621. In addition, the second polarizer 622 may be attached to the first substrate to attach the display module 61 and the fingerprint identification module 62 together to form the display panel.

In addition, the first polarizer in embodiments of the present disclosure may include a first quarter-wave plate and a third linear polarizer which are stacked. The first quarter-wave plate is arranged at a side close to the organic light emitting layer of the third linear polarizer. The second polarizer may include a second quarter-wave plate and a fourth linear polarizer which are stacked. The second quarter-wave plate is arranged at a side close to the organic light emitting layer of the fourth linear polarizer. The first quarter-wave plate and the second quarter-wave plate are the same in materials and thicknesses. Facing a transmission direction of the fingerprint signal light, by taking an anticlockwise direction as a forward direction, an included angle between a direction of an optical axis of the first quarter-wave plate and the polarization direction of the third linear polarizer is 45°; and an included angle between a direction of an optical axis of the second quarter-wave plate and the polarization direction of the fourth linear polarizer is −45°. Or, an included angle between a direction of an optical axis of the first quarter-wave plate and the polarization direction of the third linear polarizer is −45°; and an included angle between a direction of an optical axis of the second quarter-wave plate and the polarization direction of the fourth linear polarizer is 45°. Thus, the first polarizer and the second polarizer are both circular polarizers.

Figure 21A:
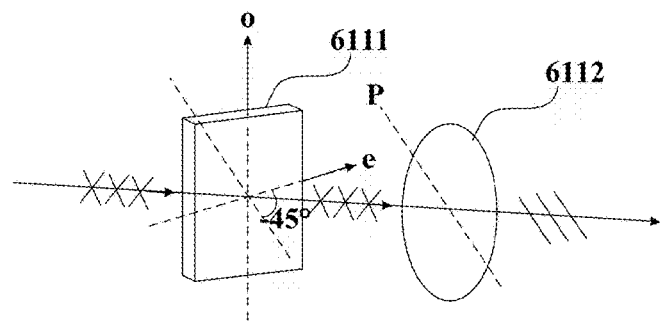
FIG. 21A is a schematic diagram illustrating an optical path before light emitted from an organic light emitting layer being reflected by a touch body provided by an embodiment of the present disclosure.
Figure 21B:
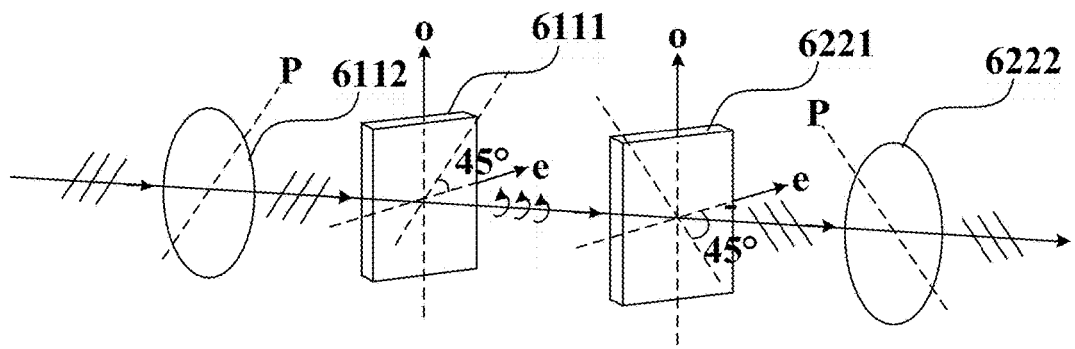
FIG. 21B is a schematic diagram illustrating an optical path after light emitted from an organic light emitting layer being reflected by a touch body provided by an embodiment of the present disclosure.
Figure 22:
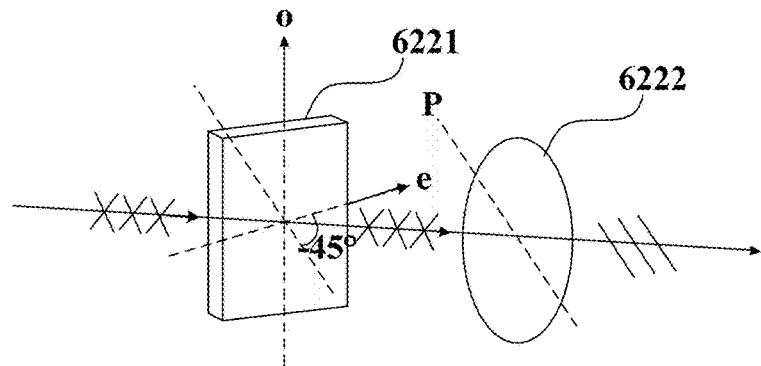
FIG. 22 is a schematic diagram illustrating an optical path of fingerprint noise light emitted from an organic light emitting layer provided by an embodiment of the present disclosure.

Exemplarily, the first quarter-wave plate and the second quarter-wave plate are optionally made of calcite, and an e axis of the first quarter-wave plate and the second quarter-wave plate is served as an optical axis. By continuing to refer to FIG. 20, in the fingerprint identification phase, as shown in FIG. 21A, before the light emitted from the organic light emitting layer 612 is reflected by the touch body, facing a transmission direction of the light, by taking an anticlockwise direction as the forward direction, an included angle between a direction of the e axis of the first quarter-wave plate and the polarization direction P of the third linear polarizer 6112 is −45°. Natural light emitted from the organic light emitting layer 612 is still natural light after passing through the first quarter-wave plate 6111, and after passing through the third linear polarizer 6112, become linearly polarized light having a polarization direction the same as the polarization direction P of the third linear polarizer 6112 and located in a second quadrant and a fourth quadrant. With reference to FIG. 21B, the linearly polarized light forms the fingerprint signal light after being reflected through the touch body, and is still linearly polarized light with an unchanged polarization direction. However, facing the transmission direction of the fingerprint signal light, an included angle between a direction of the e axis of the first quarter-wave plate and the polarization direction of the third linear polarizer 6112 is 45°, the fingerprint signal light is the linearly polarized light with the polarization direction located in a first quadrant and a third quadrant; and a polarization state and the light intensity of the fingerprint signal light when passing through the third linear polarizer 6112 again are unchanged, and fingerprint signal light becomes levorotatory circularly polarized light when passing through the first quarter-wave plate 6111 and the light intensity is unchanged. When passing through the second quarter-wave plate 6221, the levorotatory circularly polarized light becomes the linearly polarized light with the polarization direction located in the second quadrant and the fourth quadrant and has unchanged light intensity. The linearly polarized light with the unchanged light intensity is outputted through the fourth linear polarizer 6222 with the polarization direction parallel with the polarization direction of the linearly polarized light. However, with reference to FIG. 22, the fingerprint noise light emitted from the organic light emitting layer directly enters the second polarizer. Facing a transmission direction of the fingerprint noise light, an included angle between a direction of the e axis of the second quarter-wave plate 6221 and the polarization direction P of the fourth linear polarizer 6222 is −45°. The fingerprint noise light is still the natural light after passing through the second quarter-wave plate 6221. The natural light passes through the fourth linear polarizer 6222 to become linearly polarized light having a polarization direction identical with the polarization direction P of the fourth linear polarizer 6222 and located in a second quadrant and a fourth quadrant, but half of the light intensity is lost. Therefore, the second polarizer can reduce the light intensity of the fingerprint noise light to increase the signal-to-noise ratio. The display panel in embodiments of the present disclosure is also optionally a flexible display panel. In embodiments of the present disclosure, the included angle between the direction of the optical axis of the first quarter-wave plate and the polarization direction of the third linear polarizer and the included angle between the direction of the optical axis of the second quarter-wave plate and the polarization direction of the fourth linear polarizer only need to satisfy limiting conditions of above embodiments.

Figure 23A:
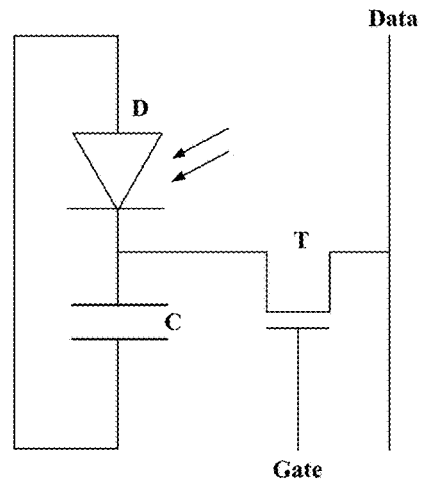
FIG. 23A is a circuit diagram illustrating a fingerprint sensor in a fingerprint identification module provided by an embodiment of the present disclosure.
Figure 23B:
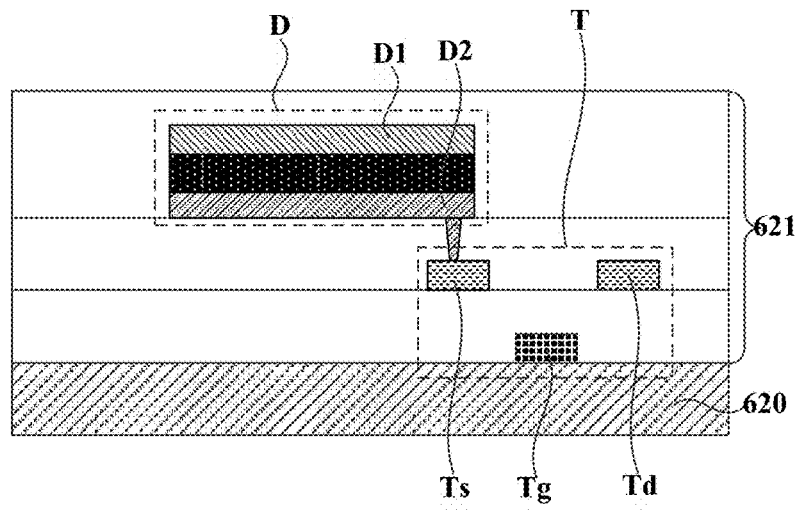
FIG. 23B is a cross sectional structural schematic diagram illustrating a fingerprint sensor in a fingerprint identification module provided by an embodiment of the present disclosure.

The fingerprint identification unit in any of above embodiments of the present disclosure may include a fingerprint sensor. Optionally, as shown in FIG. 23A and FIG. 23B, the above fingerprint sensor includes a photosensitive diode D, a storage capacitor C and a thin film transistor T. The positive electrode D1 of the photosensitive diode D is electrically connected with a first electrode of the storage capacitor C. The negative electrode D2 is electrically connected with a second electrode of the storage capacitor C and the source Ts of the thin film transistor T. The gate Tg of the thin film transistor T is electrically connected with the gate of a switch control line. The drain Td is electrically connected with the Data line of the signal detection line. The photosensitive diode D is configured to transform the fingerprint signal light into current signals. In the fingerprint identification phase, the gate of the switch control line controls the thin film transistor T to be turned on, and the current signals are transmitted to the Data line of the signal detection line through the thin film transistor T, to perform fingerprint identification according to the current signals.

Figure 24:
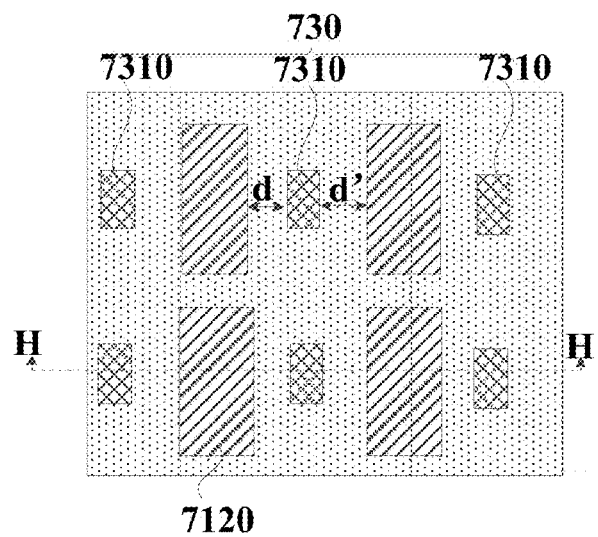
FIG. 24 is a schematic diagram illustrating a display panel provided by an embodiment of the present disclosure.
Figure 25:
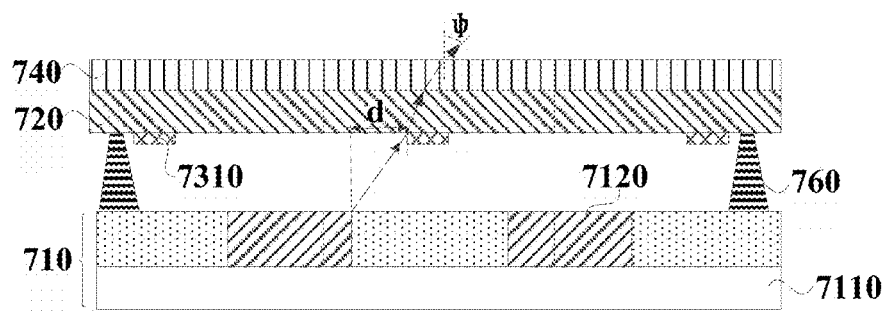
FIG. 25 is a cross sectional schematic diagram illustrating a display panel along a sectional line in FIG. 24.

FIG. 24 is a schematic diagram illustrating a display panel provided by embodiments of the present disclosure. FIG. 25 is a cross sectional schematic diagram illustrating a display panel along a cut line H-H in FIG. 24. With reference to FIG. 24 and FIG. 25, the display panel includes an array substrate 710, an encapsulating layer 720 and a fingerprint identification module 730. The array substrate 710 includes a first substrate 7110 and a plurality of light emitting units 7120 disposed on the first substrate 7110. The encapsulating layer 720 is arranged at a side facing away from the first substrate 7110 of the plurality of light emitting units 7120. The fingerprint identification module 730 is arranged on the encapsulating layer 720, and includes at least one fingerprint identification unit 7310. The vertical projection of the fingerprint identification unit 7310 on the array substrate 710 is in a non-light emitting region of the array substrate 710, and the non-light emitting region is located between adjacent light emitting units 7120. A horizontal distance d between the edge of the fingerprint identification unit 7310 and the edge of a closest light emitting unit 7120 is greater than or equal to a preset distance, so that the display panel has a maximum light emergent angle $\psi$, where $\psi$ is greater than or equal to 50°.

Specifically, a maximum light emergent angle $\psi$ of the display panel is a maximum included angle between emergent light and a vertical line of the light emergent surface of the display panel, on the light emergent surface of the display panel. The larger the maximum light emergent angle $\psi$ of the display panel is, the larger the visual angle of the display panel is. With reference to FIG. 25, the display panel may further include a cover plate 740. If a surface facing away from the array substrate 710 of the cover plate 740 is the light emergent surface of the display panel, the maximum included angle between the emergent light and the vertical line of the surface facing away from the array substrate 710 of the cover plate 740 is the maximum light emergent angle $\psi$ of the display panel.

Figure 26:
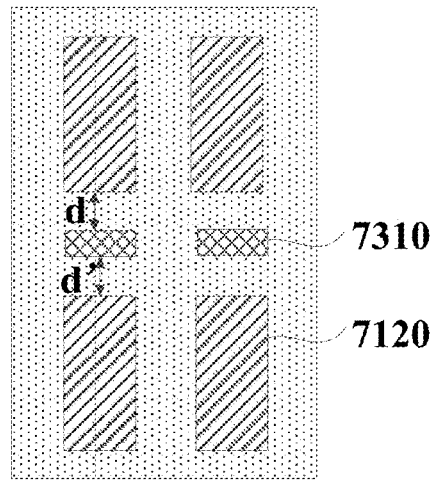
FIG. 26 is a structural schematic diagram illustrating another display panel provided by an embodiment of the present disclosure.

Among a plurality of light emitting units 7120 adjacent to the fingerprint identification unit 7310, a light emitting unit 7120 the edge of which is closest to the edge of the fingerprint identification unit 7310 is the closest light emitting unit 7120 for the fingerprint identification unit 7310. FIG. 26 is a schematic diagram illustrating another display panel provided by embodiments of the present disclosure. With reference to FIG. 24 and FIG. 26, the non-light emitting region may be a region between two adjacent columns of light emitting units 7120, and may also be a region between two adjacent rows of light emitting units 7120, which can be selected according to an arrangement mode of the light emitting units 7120 of the display panel and is not be specifically limited. With reference to FIG. 24 and FIG. 26, the closest light emitting unit 7120 for the fingerprint identification unit 7310 can be determined according to distances d and d' from two adjacent columns (or two adjacent rows) of light emitting units 7120 of the fingerprint identification unit 7310 to the edge of the fingerprint identification unit 7310 respectively. The light emitting unit 7120 with a smaller distance is the closest light emitting unit 7120 of the fingerprint identification unit 7310. In addition, in the present embodiment, w is set to be greater than or equal to 50°, to satisfy basic needs of users for the visual angle of the display panel, so that the users can see more clear display pictures when seeing the display pictures sideways. ψ can also be set to be greater than or equal to 60° according to the needs of the users for the visual angle of the display panel, which is not limited herein.

In the present embodiment, the fingerprint identification module 730 is arranged on the encapsulating layer 720 of the display panel, and a vertical projection of the fingerprint identification unit 7310 on the array substrate 710 is in the non-light emitting region of the array substrate 710, so that the fingerprint identification module 730 can be arranged in the display region of the display panel, thereby increasing a screen-to-body ratio of the display panel and satisfying a development trend of edge narrowing of the display panel. In addition, since a lower surface of the fingerprint identification unit 7310 is opaque, when the light rays emitted from the light emitting unit 7120 irradiate the edge of the fingerprint identification unit 7310, the light rays are blocked by the lower surface of the fingerprint identification unit 7310, thereby influencing the light emergent angle of the display panel. In the present embodiment, the horizontal distance d between the edge of the fingerprint identification unit 7310 and the edge of a light emitting region of the closest light emitting unit 7120 is set to be greater than or equal to the preset distance, so that the fingerprint identification unit 7310 arranged on the display region of the display panel does not influence the light emergent angle of the display panel, thereby ensuring that the display panel has a large visual angle.

Figure 27:
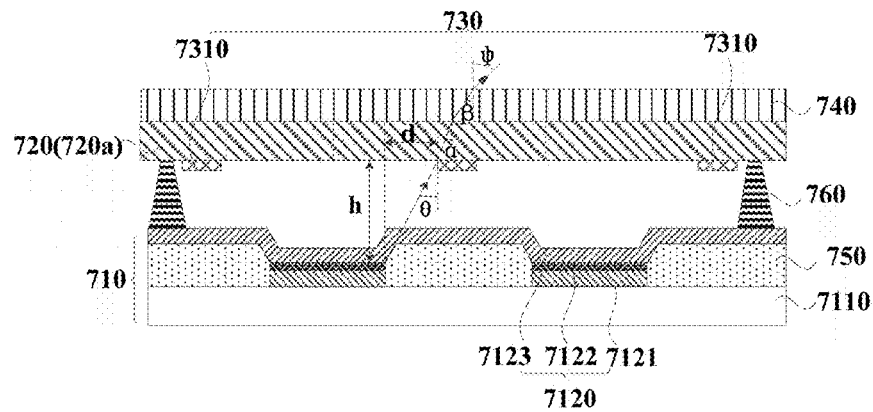
FIG. 27 to FIG. 32 are cross sectional schematic diagrams illustrating various display panels provided by embodiments of the present disclosure.

FIG. 27 is a cross sectional schematic diagram illustrating another display panel provided by embodiments of the present disclosure. Optionally, with reference to FIG. 27, the light emitting unit 7120 includes a first electrode 7121, a light emitting layer 7122 and a second electrode 7123. The light emitting layer 7122 is arranged between the first electrode 7121 and the second electrode 7122. The array substrate 710 further includes a pixel defining layer 750. The pixel defining layer 750 has an opening region. The light emitting layer 7122 of the light emitting unit 7120 is located in the opening region. The second electrode 7123 covers the light emitting layer 7122 and a non-opening region of the pixel defining layer 750. A vertical projection of the fingerprint identification unit 7310 on the array substrate 710 is in the non-opening region of the pixel defining layer 750. The encapsulating layer 720 is a transparent rigid cover plate 720a. The fingerprint identification module 730 is arranged at a side close to the array substrate 710 of the transparent rigid cover plate 720a. Then, d≥h*tan ψ, where h is a vertical distance from the fingerprint identification unit 7310 to a light exiting side of the light emitting layer 7122 of the light emitting unit 7120.

A supporting pillar 760 is arranged between the transparent rigid cover plate 720a and the array substrate 710, and configured to support the transparent rigid cover plate 720a. Air or nitrogen is filled in a gap between the transparent rigid cover plate 720a and the array substrate 710. The light rays emitted from the light emitting layer 7122 of the light emitting unit 7120 are emitted to the air after passing through the second electrode 7122, the gap between the transparent rigid cover plate 720a and the array substrate 710, the transparent rigid cover plate 720a and the cover plate 740. Since a thickness of the second electrode 7122 is thin, a refraction effect of the second electrode 7122 can be ignored in a propagation process of the light rays. It can be obtained according to a refraction law that: $n_1 \sin \theta = n_2 \sin \alpha = n_3 \sin \beta = n_1 \sin \psi$, so as to obtain that:

$$\theta = \psi,$$
$$\tan\psi = \tan\theta = \frac{d}{h}.$$

When the display panel has the maximum light emergent angle ψ, d=h*tan ψ. Therefore, the preset distance is h*tan ψ. When d is greater than or equal to h*tan ψ, the display panel has the maximum light emergent angle ψ.

$n_1$ is the refraction index of the air; $n_2$ is the refraction index of the transparent rigid cover plate 20a; $n_3$ is the refraction index of the cover plate 740; θ is a propagation angle of the light rays in the gap between the transparent rigid cover plate 720a and the array substrate 710; α is a propagation angle of the light rays in the transparent rigid cover plate 720a; and β is a propagation angle of the light rays in the cover plate 40, where the propagation angle means an included angle between the light rays and the vertical line of each film of the display panel. Optionally, if h=4 um and ψ≥50°, then d≥4.8 um, where h can be computed according to the thickness of the second electrode 7123, the thickness of the pixel defining layer 750, the thickness of the supporting pillar 760 and the like. When the thickness of each film of the display panel is changed, h can also be other values and is not specifically limited by the present disclosure.

In the present embodiment, the fingerprint identification module 730 is arranged at a side close to the array substrate 710 of the transparent rigid cover plate 720a, and the horizontal distance d between the edge of the fingerprint identification unit 7310 and the edge of the light emitting region of the closest light emitting unit 7120 is set to be greater than or equal to h*tan ψ, so that the fingerprint identification module 730 can be arranged in the display region of the display panel, thereby increasing the screen-to-body ratio of the display panel, enabling the display panel to reach the maximum light emergent angle ψ, ensuring that the display panel has a large visual angle and improving user experience.

Figure 28:
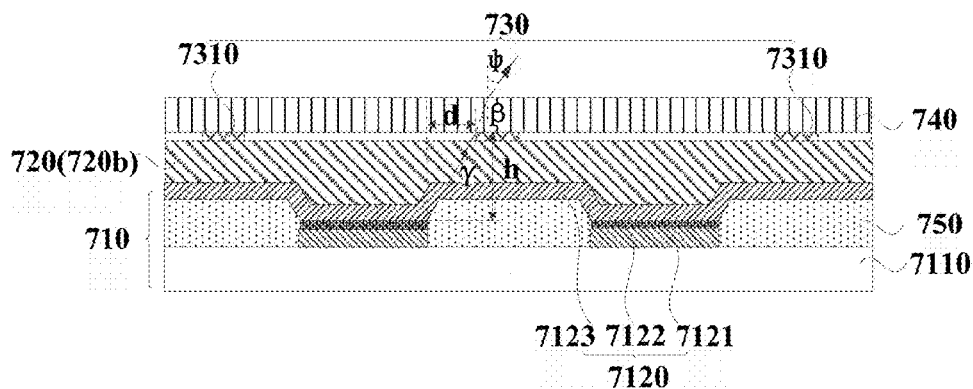

FIG. 28 is a cross sectional schematic diagram illustrating another display panel provided by embodiments of the present disclosure. Optionally, the encapsulating layer 720 is a film encapsulating layer 720b. The fingerprint identification module 730 is arranged at a side facing away from the array substrate 710 of the film encapsulating layer 720b, then $$\frac{n_{TFE} * d}{\sqrt{d^2 + h^2}} \geq \sin\psi,$$

where h is a vertical distance from the fingerprint identification unit 7310 to a light exiting side of the light emitting layer 7122 of the light emitting unit 7120, and nirE is the refraction index of the film encapsulating layer 20b. The light rays emitted from the light emitting layer 7122 of the light emitting unit 7120 are emitted to the air after passing through the second electrode 7122, the film encapsulating layer 720b and the cover plate 740. Since thicknesses of the second electrode 7122 and the fingerprint identification unit 7310 are thin and the influence on propagation of the light rays is small, the influence can be ignored in the propagation process of the light rays. It can be obtained according to a refraction law that:

$$n_{TFE}\sin\gamma = n_3\sin\beta = n_1\sin\psi,$$

$$\sin\psi = \frac{d}{\sqrt{d^2 + h^2}},$$

so as to obtain that:

$$\frac{n_{TFE} * d}{\sqrt{d^2 + h^2}} \geq \sin\psi.$$

As can be seen, when the display panel has the maximum light emergent angle ψ, $$\frac{n_{TFE} * d}{\sqrt{d^2 + h^2}} \geq \sin\psi.$$

Therefore, when $$\frac{n_{TFE} * d}{\sqrt{d^2 + h^2}} \geq \sin\psi,$$

display panel has the maximum light emergent angle ψ, where $n_1=1$; $n_3$ is the refraction index of the cover plate 740; γ is a propagation angle of the light rays in the film encapsulating layer 720b; and β is a propagation angle of the light rays in the cover plate 740.

Optionally, when $h_1=8$ um, $n_{TFE}=1.5$, and ψ≥50°, d is greater than or equal to 4.7 um, where h can be computed according to the thickness of the film encapsulating layer 720b, the thickness of the second electrode 7123 and the like. In addition, a material with a thicker thickness in the film encapsulating layer 720b is generally an organic material and an inorganic material is very thin. Therefore, the refraction index of the film encapsulating layer 720b may be the refraction index of the organic material, i.e., 1.5. When the thickness of each film of the display panel is changed, $h_1$ and $h_2$ can also be other values and are not specifically limited by the present disclosure.

Figure 29:
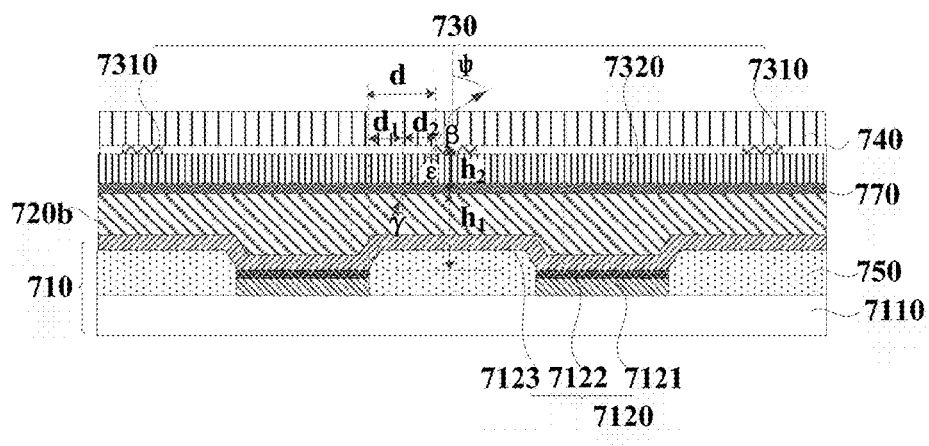

FIG. 29 is a cross sectional view illustrating another display panel provided by embodiments of the present disclosure. The fingerprint identification module 730 further includes a second substrate 7320. The fingerprint identification unit 7310 is formed on the second substrate 7320. One side facing away from the fingerprint identification unit 7310 of the second substrate 7320 is attached to the surface facing away from the array substrate 710 of the film encapsulating layer 720b through an adhesive layer 770. Then, $d=d_1+d_2$, $$\frac{n_{TFE} * d_1}{\sqrt{d_1^2 + h_1^2}} \geq \sin\psi$$

and $$\frac{n_{Pl} * d_2}{\sqrt{d_2^2 + h_2^2}} \geq \sin\psi,$$

where $n_{TFE}$ is the refraction index of the film encapsulating layer 720b; $h_1$ is a vertical distance from an interface between the film encapsulating layer 720b and the adhesive layer 770 to the light exiting side of the light emitting layer 7122 of the light emitting unit 7120; $d_1$ is a horizontal distance from an exiting point of the interface between the film encapsulating layer 720b and the adhesive layer 770 of the light emitted from the edge of the light emitting region of the light emitting unit 7120 to the edge of the light emitting region; nin is the refraction index of the second substrate 320; $h_2$ is a thickness sum of the adhesive layer 770 and the second substrate 7320; and $d_2$ is a horizontal distance from the exiting point of the interface between the film encapsulating layer 720b and the adhesive layer 770 of the light emitted from the edge of the light emitting region of the light emitting unit 7120 to the edge of the fingerprint identification unit 7310.

With reference to FIG. 29, the light rays emitted from the light emitting layer 7122 of the light emitting unit 7120 are emitted to the air after passing through the second electrode 7122, the film encapsulating layer 720b, the adhesive layer 770, the second substrate 7320 and the cover plate 740. Since the second electrode 7122 and the adhesive layer 770 are thin, the refraction effect of the second electrode 7122 and the adhesive layer 770 can be ignored in a propagation process of the light rays. Moreover, the fingerprint identification unit 7310 is thin, the thickness is ignored. It can be obtained according to a refraction law that:

$$n_{TFE}\sin\gamma = n_{Pl}$$

$$\sin\varepsilon = n_3$$

$$\sin\beta = n_1\sin\psi,$$

$$\sin\gamma = \frac{d_1}{\sqrt{d_1^2 + h_1^2}},$$

$$\sin\varepsilon = \frac{d_2}{\sqrt{d_2^2 + h_2^2}},$$

so as to obtain that:

$$\frac{n_{TFE} * d_1}{\sqrt{d_1^2 + h_1^2}} = \sin\psi,$$

$$\frac{n_{Pl} * d_2}{\sqrt{d_2^2 + h_2^2}} = \sin\psi.$$

Therefore, when the display panel has the maximum light emergent angle $\psi$, $$\frac{n_{TFE} * d_1}{\sqrt{d_1^2 + h_1^2}} = \sin\psi$$

and $$\frac{n_{pl} * d_2}{\sqrt{d_2^2 + h_2^2}} = \sin\psi.$$

Therefore, when $$\frac{n_{TFE} * d_1}{\sqrt{d_1^2 + h_1^2}} \geq \sin\psi$$

and $$\frac{n_{pl} * d_2}{\sqrt{d_2^2 + h_2^2}} \geq \sin\psi,$$

the display panel has the maximum light emergent angle $\psi$, where $n_1=1$ and $n_3$ is the refraction index of the cover plate 740; $\gamma$ is a propagation angle of the light rays in the film encapsulating layer 720b; $\varepsilon$ is a propagation angle of the light rays in the second substrate 7320; and $\beta$ is a propagation angle of the light rays in the cover plate 740. Optionally, when $h_1=8$ um, $n_{TFE}=1.5$, $h_2=10$ um, $n_{P1}=1.6$, and $\psi \geq 50°$, $d_1$ is greater than or equal to 4.7 um and $d_2$ is greater than or equal to 5.4 um. Therefore, d is greater than or equal to 10.1 um.

In the present embodiment, the fingerprint identification module 730 is arranged at a side facing away from the array substrate 710 of the film encapsulating layer 720b, and the horizontal distance d between the edge of the fingerprint identification unit 7310 and the edge of the light emitting region of the closest light emitting unit 7120 is set to be greater than or equal to a preset distance, so that the fingerprint identification module 730 is arranged in the display region of the display panel, thereby increasing the screen-to-body ratio of the display panel, enabling the display panel to have the maximum light emergent angle $\psi$, ensuring that the display panel has a large visual angle and improving user experience. Moreover, since the fingerprint identification module 730 is arranged after the film encapsulating layer 720b is completely manufactured, the film encapsulating layer 720b is ensured to have better water resistance and oxygen resistance effects and a probability that the display panel is corroded is reduced.

Figure 30:
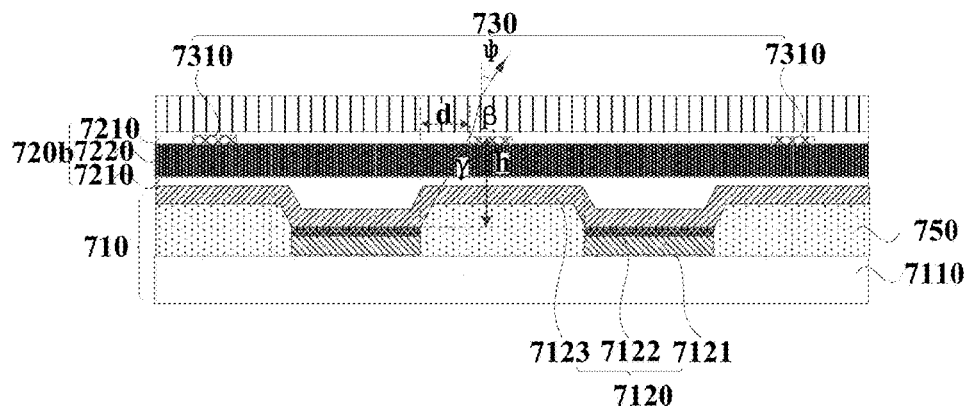

FIG. 30 is a cross sectional schematic diagram illustrating another display panel provided by embodiments of the present disclosure. Optionally, with reference to FIG. 30, the fingerprint identification unit 7310 can also be located in the film encapsulating layer 720b. The film encapsulating layer 720b may include a plurality of inorganic layers 7210 and organic layers 7220 arranged alternatively. The fingerprint identification unit 7310 may be arranged at one side facing away from the array substrate 710 of the organic layers 7210 or the inorganic layers 7220. Since the inorganic layers 7210 are thin, a refraction effect of the inorganic layers 7210 for the light rays can be ignored. It can be obtained according to a refraction law that, when the display panel has the maximum light emergent angle $\psi$, $d=h*\tan\psi$. Therefore, the preset distance is $h*\tan\psi$. If d is greater than or equal to the preset distance, the display panel has the maximum light emergent angle $\psi$.

In addition, the fingerprint identification unit 7310 may also be arrange at a side close to the array substrate 710 of the film encapsulating layer 720b as long as the fingerprint identification unit 7310 is insulated from the second electrode 7122. At this moment, since the vertical distance from the fingerprint identification unit 7310 to the light exiting side of the light emitting layer 7122 is short, and an influence on the light emergent angle of the light rays emitted from the light emitting layer 7122 is small, the preset distance can be any numerical value greater than or equal to zero. It should be noted that above embodiments only show a condition that only the cover plate 740 is arranged at a side facing away from the array substrate 710 of the encapsulating layer 720 (the transparent rigid cover plate 720a or the film encapsulating layer 720b), and do not limit the present disclosure. Polarizers and other films can also be arranged between the encapsulating layer 720 and the cover plate 740. When other films are arranged between the encapsulating layer 20 and the cover plate 40, the preset distance can be obtained in accordance with the above derivation process according to the refraction law.

Figure 31:
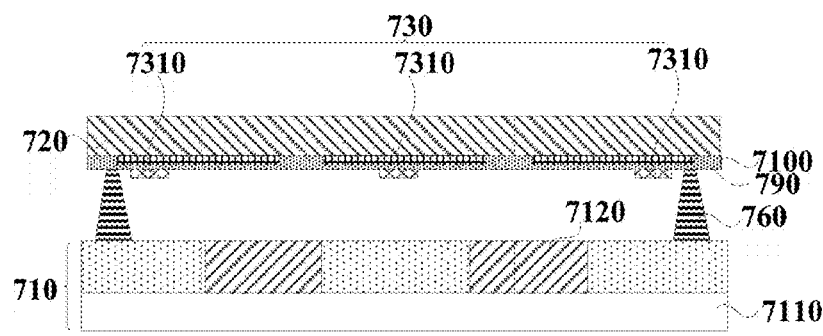
Figure 32:
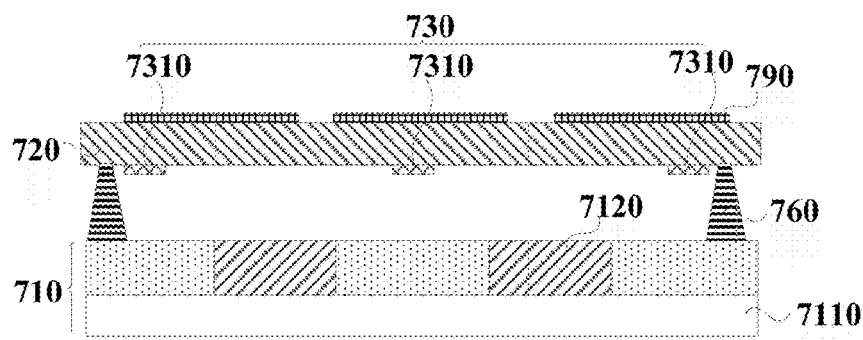

FIG. 31 is a cross sectional schematic diagram illustrating another display panel provided by embodiments of the present disclosure. The display panel further includes: a touch electrode 790. The fingerprint identification module 730 and the touch electrode 790 are located at the same side of the encapsulating layer 720. To avoid mutual interference, an insulating layer 7100 needs to be arranged between the touch electrode 790 and the fingerprint identification module 730, The touch electrode 790 may be a mutual capacitance type touch electrode, and may also be a self-capacitance type touch electrode. With reference to FIG. 32, the fingerprint identification module 730 and the touch electrode 790 are located at different sides of the encapsulating layer 720. In this way, mutual interference between the touch electrode 790 and the fingerprint identification module 730 can be avoided without installing the insulating layer, thereby reducing the thickness of the display panel and reducing technological steps.

Figure 33:
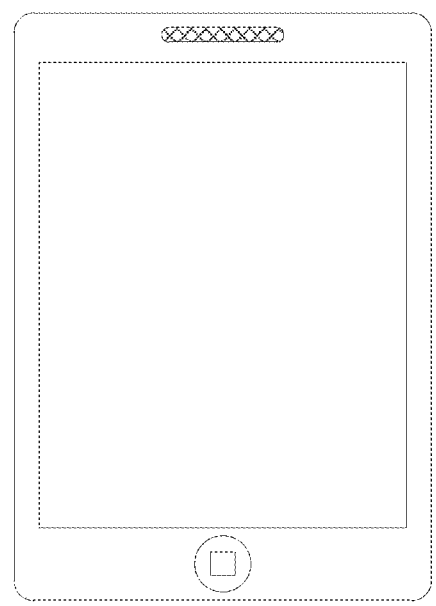
FIG. 33 is a schematic diagram illustrating an electronic device provided by another embodiment of the present disclosure.

Embodiments of the present disclosure further provide an electronic device. FIG. 33 is a schematic diagram illustrating an electronic device provided by another embodiment of the present disclosure. As shown in FIG. 33, the electronic device provided by embodiments of the present disclosure includes the display panel or the display apparatus of any embodiment of the present disclosure. The electronic device may be a mobile phone shown in FIG. 33, and may also be a computer, a television, an intelligent wearable device and the like, and is not particularly limited in the present embodiment.

It should be noted that the above contents are only preferred embodiments of the present disclosure and used technical principles. It can be understood for those skilled in the art that the present disclosure is not limited to specific embodiments described herein. For those skilled in the art, the present disclosure can be subject to various apparent variations, readjustments and replacements without departing from a protection scope of the present disclosure. Therefore, although the present disclosure is described in detail through above embodiments, the present disclosure is not only limited to above embodiments. The present disclosure can also include more other equivalent embodiments without deviating from conceptions of the present disclosure. A scope of the present disclosure is determined by a scope of attached claims.

What is claimed is:

1. A display apparatus, comprising:
   a display panel and a cover plate disposed on the display panel, wherein the display panel comprises an array substrate, an organic light emitting layer disposed at one side of the array substrate facing the cover plate, and a fingerprint identification array; the organic light emitting layer comprises a plurality of organic light emitting configurations, wherein light emerges from a first surface of the cover plate facing away from the array substrate;
   wherein in a fingerprint identification phase, the plurality of organic light emitting configurations are arranged to emit light according to a first light emitting lattice, wherein the first emitting lattice comprises a plurality of organic light emitting configurations being illuminated, and the first emitting lattice shifts for each frame to be displayed; a distance between any two adjacent organic light emitting configurations in the first light emitting lattice is greater than or equal to a minimum crosstalk-free distance, wherein the minimum crosstalk-free distance is a maximum radius of a covering region formed on the fingerprint identification array by the light emitted from any organic light emitting configuration and reflected through the first surface of the cover plate,
   wherein the organic light emitting layer successively comprises a first electrode, a light emitting functional layer and a second electrode in a direction in which the organic light emitting configurations are away from the array substrate; wherein $L = \tan\theta * H1 + \tan\theta * H2,$ wherein L is the minimum crosstalk-free distance; θ is an included angle between a direction corresponding to a preset brightness of the organic light emitting configurations and a direction perpendicular to the organic light emitting layer; H1 is a height from the first surface of the cover plate to the light emitting functional layer in the direction perpendicular to the display apparatus; H2 is a height from the first surface of the cover plate to the fingerprint identification array in the direction vertical to the display apparatus; and
   wherein the preset brightness is less than or equal to 10% of a brightness in the direction perpendicular to the organic light emitting layer.

2. The display apparatus according to claim 1, wherein the organic light emitting configurations in the first light emitting lattice form a plurality of patterns; and an angle of each corner of a pattern with a minimum area in the plurality of patterns is not equal to 90°.

3. The display apparatus according to claim 2, wherein the first light emitting lattice is a pentagonal light emitting lattice, and the pentagonal light emitting lattice comprises a central organic light emitting configuration and five marginal organic light emitting configurations.

4. The display apparatus according to claim 2, wherein the first light emitting lattice is a hexagonal light emitting lattice, and the hexagonal light emitting lattice comprises a central organic light emitting configuration and six marginal organic light emitting configurations.

5. The display apparatus according to claim 1, wherein the first light emitting lattice comprises first light emitting rows and second light emitting rows arranged alternately, wherein any organic light emitting configuration in the first light emitting rows and any organic light emitting configuration in the second light emitting rows are located in different columns.

6. The display apparatus according to claim 1, wherein the distance between any two adjacent organic light emitting configurations in the first light emitting lattice is equal to the minimum crosstalk-free distance.

7. The display apparatus according to claim 1, wherein for any two adjacent organic light emitting configurations located in different rows in the first light emitting lattice, a vertical distance from one organic light emitting configuration to a row in which the other organic light emitting configuration is located is smaller than the minimum crosstalk-free distance.

8. The display apparatus according to claim 7, wherein for any two adjacent organic light emitting configurations located in different columns in the first light emitting lattice, a vertical distance from one organic light emitting configuration to a column in which the other organic light emitting configuration is located is smaller than the minimum crosstalk-free distance.

9. The display apparatus according to claim 1, wherein for any two adjacent organic light emitting configurations located in different columns in the first light emitting lattice, a vertical distance from one organic light emitting configuration to a column in which the other organic light emitting configuration is located is smaller than the minimum crosstalk-free distance.

10. The display apparatus according to claim 1, wherein the fingerprint identification array is disposed at a side facing away from the cover plate of the array substrate.

11. The display apparatus according to claim 1, wherein a thin film transistor array, the fingerprint identification array and the organic light emitting layer are stacked at a side of the array substrate facing the cover plate.

12. The display apparatus according to claim 1, wherein a thin film transistor array, the organic light emitting layer and the fingerprint identification array are stacked at the side of the array substrate facing the cover plate, wherein the organic light emitting layer comprises a display region and a non-display region, and a projection of the fingerprint identification array in the direction perpendicular to the display apparatus is in the non-display region of the organic light emitting layer.

13. The display apparatus according to claim 1, wherein the display panel further comprises an encapsulating glass disposed at the side of the array substrate facing the cover plate, wherein the organic light emitting layer is disposed at the side of the array substrate facing the cover plate, and wherein the fingerprint identification array is disposed at a side facing the array substrate of the encapsulating glass;
   wherein the organic light emitting layer comprises a display region and a non-display region; and
   wherein a projection of the fingerprint identification array in the direction perpendicular to the display apparatus is in the non-display region of the organic light emitting layer.

14. The display apparatus according to claim 1, wherein the display panel further comprises a film encapsulating layer disposed at the side of the array substrate facing the cover plate, wherein the organic light emitting layer is disposed at the side of the array substrate facing the cover plate, and wherein the fingerprint identification array is disposed at a side facing the array substrate of the film encapsulating layer; wherein the organic light emitting layer comprises a display region and a non-display region; and wherein a projection of the fingerprint identification array in the direction perpendicular to the display apparatus is in the non-display region of the organic light emitting layer.

15. The display apparatus according to claim 1, wherein the display panel further comprises a film encapsulating layer disposed at the side of the array substrate facing the cover plate, wherein the organic light emitting layer is disposed at the side of the array substrate facing the cover plate, and wherein the fingerprint identification array is disposed at a side of the film encapsulating layer facing away from the array substrate; wherein the organic light emitting layer comprises a display region and a non-display region; and wherein a projection of the fingerprint identification array in the direction perpendicular to the display apparatus is in the non-display region of the organic light emitting layer.

16. The display apparatus according to claim 10, wherein the fingerprint identification array comprises a plurality of fingerprint identification units, and wherein the plurality of fingerprint identification units and the plurality of organic light emitting configurations are correspondingly arranged respectively.

17. The display apparatus according to claim 1, wherein the display apparatus is an organic light emitting display apparatus.

18. An electronic device comprising a display apparatus, wherein the display apparatus comprises:
a display panel and a cover plate disposed on the display panel, wherein the display panel comprises an array substrate, an organic light emitting layer disposed at one side of the array substrate facing the cover plate, and a fingerprint identification array; the organic light emitting layer comprises a plurality of organic light emitting configurations, wherein light emerges from a first surface of the cover plate facing away from the array substrate;
wherein in a fingerprint identification phase, the plurality of organic light emitting configurations are arranged to emit light according to a first light emitting lattice, wherein the first emitting lattice comprises a plurality of organic light emitting configurations being illuminated, and the first emitting lattice shifts for each frame to be displayed; a distance between any two adjacent organic light emitting configurations in the first light emitting lattice is greater than or equal to a minimum crosstalk-free distance, wherein the minimum crosstalk-free distance is a maximum radius of a covering region formed on the fingerprint identification array by the light emitted from any organic light emitting configuration and reflected through the first surface of the cover plate;
wherein the organic light emitting layer successively comprises a first electrode, a light emitting functional layer and a second electrode in a direction in which the organic light emitting configurations are away from the array substrate; wherein $$L=\tan\theta * H1 + \tan\theta * H2,$$

wherein L is the minimum crosstalk-free distance; θ is an included angle between a direction corresponding to a preset brightness of the organic light emitting configurations and a direction perpendicular to the organic light emitting layer; H1 is a height from the first surface of the cover plate to the light emitting functional layer in the direction perpendicular to the display apparatus; H2 is a height from the first surface of the cover plate to the fingerprint identification array in the direction vertical to the display apparatus; and wherein the preset brightness is less than or equal to 10% of a brightness in the direction perpendicular to the organic light emitting layer.

19. A fingerprint identification method of a display apparatus, wherein the display apparatus comprises: a display panel and a cover plate disposed on the display panel, wherein the display panel comprises an array substrate, an organic light emitting layer disposed at a side of the array substrate facing the cover plate, and a fingerprint identification array; wherein the organic light emitting layer comprises a plurality of organic light emitting configurations; light emerges from a first surface of the cover plate facing away from the array substrate; wherein the organic light emitting layer successively comprises a first electrode, a light emitting functional layer and a second electrode in a direction in which the organic light emitting configurations are away from the array substrate; wherein $$L=\tan\theta * H1 + \tan\theta * H2,$$

wherein L is a minimum crosstalk-free distance; θ is an included angle between a direction corresponding to a preset brightness of the organic light emitting configurations and a direction perpendicular to the organic light emitting layer; H1 is a height from the first surface of the cover plate to the light emitting functional layer in the direction perpendicular to the display apparatus; H2 is a height from the first surface of the cover plate to the fingerprint identification array in the direction vertical to the display apparatus, wherein the preset brightness is less than or equal to 10% of a brightness in the direction perpendicular to the organic light emitting layer, wherein the fingerprint identification method comprises:
in a fingerprint identification phase, controlling each of the organic light emitting configurations in the organic light emitting layer to emit light according to a first light emitting lattice, the first emitting lattice comprises a plurality of organic light emitting configurations being illuminated, and the first emitting lattice shifts for each frame to be displayed, wherein a distance between any two adjacent organic light emitting configurations in the first light emitting lattice is greater than or equal to the minimum crosstalk-free distance, the minimum crosstalk-free distance is a maximum radius of a covering region formed on the fingerprint identification array by the light emitted from any organic light emitting configuration and then reflected through the first surface of the cover plate; and
performing, by the fingerprint identification array, fingerprint identification according to the light rays on each of the fingerprint identification units reflected through a touch body on the first surface of the cover plate.

* * * * *